(12) United States Patent
Kadijk et al.

(10) Patent No.: US 11,604,321 B2
(45) Date of Patent: Mar. 14, 2023

(54) LIGHT GENERATING SYSTEM COMPRISING AN ELONGATED LUMINESCENT BODY

(71) Applicant: SIGNIFY HOLDING B.V., Eindhoven (NL)

(72) Inventors: Simon Eme Kadijk, Veldhoven (NL); Dirk Kornelis Gerhardus De Boer, Den Bosch (NL); Ludovicus Johannes Lambertus Haenen, Sint Oedenrode (NL); Abraham Vamattathil Scaria, Eindhoven (NL); Johannes Martinus Jansen, Veldhoven (NL); Jianghong Yu, Best (NL); Daniel Anton Benoy, Geldrop (NL); Christoph Gerard August Hoelen, Valkenswaard (NL)

(73) Assignee: SIGNIFY HOLDING B.V., Eindhoven (NL)

( * ) Notice: Subject to any disclaimer, the term of this patent is extended or adjusted under 35 U.S.C. 154(b) by 0 days.

(21) Appl. No.: 17/299,094

(22) PCT Filed: Nov. 25, 2019

(86) PCT No.: PCT/EP2019/082387
§ 371 (c)(1),
(2) Date: Jun. 2, 2021

(87) PCT Pub. No.: WO2020/114817
PCT Pub. Date: Jun. 11, 2020

(65) Prior Publication Data
US 2022/0066109 A1    Mar. 3, 2022

(30) Foreign Application Priority Data

Dec. 4, 2018 (EP) .................................... 18209989
Aug. 13, 2019 (EP) ................................. EP19191581

(51) Int. Cl.
*G02B 6/42* (2006.01)
*F21V 9/32* (2018.01)
(Continued)

(52) U.S. Cl.
CPC .............. *G02B 6/4212* (2013.01); *F21V 9/06* (2013.01); *F21V 9/32* (2018.02); *F21V 2200/17* (2015.01);
(Continued)

(58) Field of Classification Search
CPC . G02B 6/4212; F21V 9/06; F21V 9/32; F21V 2200/17; F21Y 2103/10; F21Y 2115/10
See application file for complete search history.

(56) References Cited

U.S. PATENT DOCUMENTS 6,631,995 B2   10/2003   Stanton et al.
7,982,229 B2   7/2011    Bechtel et al.
(Continued)

FOREIGN PATENT DOCUMENTS

CN    205331818 U    6/2016
WO    0119092 A1     3/2001
(Continued)

*Primary Examiner* — Evan P Dzierzynski

(57) ABSTRACT

The invention provides an elongated luminescent body (100) comprising an elongated support (170) and a coating layer (180), wherein the elongated luminescent body (100) further comprises a body axis (BA), and a length parameter P of a body dimension perpendicular to the body axis (BA), wherein the length parameter P is selected from height (H), width (W) and diameter (D), wherein: —the elongated support (170) comprises a support material (171), a support material index of refraction n1, wherein the support material index of refraction n1 is at least 1.4, a support surface (172), and a support length (L1); —the coating layer (180) is configured on at least part of the support surface (172) over at least part of the support length (L1), wherein the coating layer (180) comprises a coating layer material (181), a
(Continued)

coating layer index of refraction n2, wherein coating layer index of refraction n2 is at least 1.4, and a coating layer thickness (d1), wherein the coating layer material (181) has a composition different from the support material (171), wherein the coating layer material (181) comprises a luminescent material (120) configured to absorb one or more of UV radiation and visible light, and to convert into luminescent material light (8) having one or more wavelengths in one or more of the visible and the infrared; and —the support material (171) is transmissive for the luminescent material light (8), and (i) $-0.2 \leq n1-n2 \leq 0.2$ and (ii) $d1/P \leq 0.25$ apply.

15 Claims, 9 Drawing Sheets

(51) Int. Cl.
*F21V 9/06* (2018.01)
*F21Y 103/10* (2016.01)
*F21Y 115/10* (2016.01)

(52) U.S. Cl.
CPC ....... *F21Y 2103/10* (2016.08); *F21Y 2115/10* (2016.08)

(56) References Cited

U.S. PATENT DOCUMENTS

| | | | |
|---|---|---|---|
| 9,810,826 B2* | 11/2017 | Chestakov | F21S 41/153 |
| 10,386,559 B2* | 8/2019 | Hikmet | G02B 6/0003 |
| 2009/0034247 A1* | 2/2009 | Boyer | F21V 31/04 |
| | | | 362/225 |
| 2009/0168395 A1* | 7/2009 | Mrakovich | F21V 13/08 |
| | | | 362/84 |
| 2012/0236533 A1* | 9/2012 | Nakamura | F21S 4/28 |
| | | | 362/84 |
| 2013/0156391 A1 | 6/2013 | Logunov et al. | |
| 2016/0054501 A1 | 2/2016 | Hikmet et al. | |
| 2016/0377785 A1 | 12/2016 | Chestakov et al. | |
| 2017/0139113 A1 | 5/2017 | Peeters | |
| 2017/0160454 A1 | 6/2017 | Tissot | |
| 2018/0119896 A1 | 5/2018 | Hikmet et al. | |
| 2018/0351060 A1* | 12/2018 | Kiba | H01L 33/38 |

FOREIGN PATENT DOCUMENTS

| | | |
|---|---|---|
| WO | 2006054203 A1 | 5/2006 |
| WO | 2018141625 A1 | 8/2018 |

\* cited by examiner

LIGHT GENERATING SYSTEM COMPRISING AN ELONGATED LUMINESCENT BODY

CROSS-REFERENCE TO PRIOR APPLICATIONS

This application is the U.S. National Phase application under 35 U.S.C. § 371 of International Application No. PCT/EP2019/082387, filed on Nov. 25, 2019, which claims the benefit of European Patent Application No. 18209989.5, filed on Dec. 4, 2018 and European Patent Application No. 19191581.8, filed Aug. 13, 2019. These applications are hereby incorporated by reference herein.

FIELD OF THE INVENTION

The invention relates to a light generating system comprising an elongated luminescent body, e.g. for use in a projector system, especially an LCD or DLP based projector, or in a lamp or in a luminaire. The invention also relates to such projector system and luminaire.

BACKGROUND OF THE INVENTION

Luminescent rods are known in the art. WO2006/054203, for instance, describes a light emitting device comprising at least one LED which emits light in the wavelength range of >220 nm to <550 nm and at least one conversion structure placed towards the at least one LED without optical contact, which converts at least partly the light from the at least one LED to light in the wavelength range of >300 nm to ≤1000 nm, characterized in that the at least one conversion structure has a refractive index n of >1.5 and <3 and the ratio A:E is >2:1 and <50000:1, where A and E are defined as follows: the at least one conversion structure comprises at least one entrance surface, where light emitted by the at least one LED can enter the conversion structure and at least one exit surface, where light can exit the at least one conversion structure, each of the at least one entrance surfaces having an entrance surface area, the entrance surface area(s) being numbered $A_1 \ldots A_n$ and each of the at least one exit surface(s) having an exit surface area, the exit surface area(s) being numbered $E_1 \ldots E_n$ and the sum of each of the at least one entrance surface(s) area(s) A being $A=A_1+A_2 \ldots +A_n$ and the sum of each of the at least one exit surface(s) area(s) E being $E=E_1+E_2 \ldots +E_n$.

SUMMARY OF THE INVENTION

High brightness light sources are interesting for various applications including spots, stage-lighting, headlamps and digital light projection, and (fluorescence) microscopy and endoscopy etc. For this purpose, it is possible to make use of so-called light concentrators where shorter wavelength light is converted to longer wavelengths in a highly transparent luminescent material. An elongated luminescent body of such a transparent luminescent material can be illuminated by LEDs to produce longer wavelengths within the rod. Converted light which will stay in the luminescent material, such as a (trivalent cerium) doped garnet, in the waveguide mode and can then be extracted from one of the (smaller) surfaces leading to an intensity gain.

For instance, an elongated luminescent body may be capable to convert blue light into green or yellow light and to collect this green or yellow light (in a small étendue output beam). The elongated luminescent body, such as a rectangular bar, may in embodiments have one or more large surfaces over the length of the bar forming the side wall(s), and two smaller surfaces at the end of the bar, with one of these smaller surfaces forming the "nose" where the desired light is extracted.

Under e.g. blue light radiation, the blue light excites the phosphor, after the phosphor start to emit green light in all directions, assuming some cerium comprising garnet applications. Since the phosphor is embedded in—in general—a high refractive index bar, a main part of the converted (green) light is trapped into the high refractive index bar and wave guided e.g. via Total Internal Reflection (TIR) to the nose of the bar where the (green) light may leave the bar. The amount of (green) light generated is proportional to the amount of blue light pumped into the bar. The longer the bar, the more blue LED's can be applied to pump phosphor material in the bar and the number of blue LED's to increase the brightness of the (green) light leaving at the nose of the bar can be used. The phosphor converted light, however, can be split into two parts.

A first part may consist of first types of light rays ("first light rays") that will hit the side walls of the bar under angles larger than the critical angle of reflection. These first light rays are trapped in the high refractive index bar and will traverse to the nose of the bar where it may leave as desired light of the system. In general, at least part of the luminescent material light may escape from the radiation exit face directly (without total internal reflection). A second part may consist of second light rays ("second light rays") that will hit the side walls of the bar at angles smaller than the total angle of reflection. These second light rays are not trapped in the bar but will leave the bar at its side walls. These second light rays may be bounced back into the bar, but in such cases these light rays will always enter the bar under angles smaller than the total angle of reflection, will traverse straight through the bar and leave the bar at the opposite side wall. Such, these second light rays may never channel to the nose of the bar. These second light rays are lost and will limit the efficiency of such illumination systems. Typically, in high referative bar-like systems, 44% of the converted light is trapped and will leave the bar at its nose, while 56% of the converted light is lost at the side walls of the bar.

A high lumen density (HLD) system may comprise a ceramic rod, where blue light is converted to create a high intensity source for theatre lighting, beamers etc. High lumen density systems may e.g. be based on cerium containing ceramic or crystalline bodies, which are used to concentrate light. Such system may be limited in the cerium content, especially when using single crystalline luminescent bodies. Further, such ceramic or crystalline bodies require high quality processing, in order to provide bodies with desirable transparencies (and essentially no scattering). In order to boost intensity, longer ceramic or crystalline bodies may be applied, which make above identified problems even more relevant.

Hence, it is an aspect of the invention to provide a light generating system comprising a luminescent body, which especially further at least partly obviates one or more of above-described drawbacks and/or which may have a relatively higher efficiency. It is also an aspect of the invention to provide an alternative light generating system comprising a luminescent concentrator, which especially further at least partly obviates one or more of above-described drawbacks and/or which may have a relatively higher efficiency. The present invention may have as object to overcome or ameliorate at least one of the disadvantages of the prior art, or to provide a useful alternative.

A breakthrough appears to be a (round) HLD rod wherein the light emission of the phosphor should essentially be at the skin of the rod. When light is emitted from the core of the rod the efficiency appears to be very poor. As indicated above, however, a round ceramic or single crystalline rod is relatively hard to make with current technologies, which involves single crystal growth, cutting, grinding to a round shape and polishing. With poly-crystalline materials the manufacturing may be easier, but lower HLD efficiencies are expected with polycrystals than with single crystal materials. Hence, it is herein proposed to apply a transparent carrier to come to a very efficient solution. Amongst others, in embodiments a transparent round rod may be the carrier for a transparent skin layer of a phosphor on the cylindrical rod side. The coating may be fully covering the cylindrical side of the rod, or only a part of the cylindrical side of the rod, e.g. a section facing the pump LEDs. In the latter case the remainder of the cylindrical side is just the carrier material, which especially is a solid and hard material that can be cooled by conduction cooling without making much real solid to solid contact. A glassy material (including variants such as fused silica glass) seems the obvious material choice for the rod, but transparent ceramics such as alumina, yttria, magnesium-aluminate spinel, aluminum oxynitride spinel, and aluminum garnets, glass-ceramics, monocrystalline materials such as sapphire (single crystal aluminum oxide), and silicones, or organic polymers, are options as well. Alternatively, a transparent bar with rectangular cross section is coated with a luminescent conversion layer, with the same options as mentioned before.

Alternatively, the coating may partly comprise luminescent conversion material. In this case, the luminescent conversion material is preferentially applied there where the coating is facing the pump LEDs. In the latter case the remainder of the coating is essentially free of luminescent conversion material.

Hence, in an aspect the invention provides a light generating system comprising a plurality of light sources configured to provide light source light, an (elongated) luminescent body ("luminescent body") comprising an (elongated) support ("support") and a coating layer, wherein the (elongated) luminescent body further comprises a body axis (BA) (and a length parameter P of a body dimension perpendicular to the body axis (BA), wherein the length parameter P may be selected from height (H), width (W) and diameter (D)), wherein:

the (elongated) support comprises a support material (or "elongated support material"), a support material index of refraction n1, wherein the support material index of refraction n1 is in specific embodiments at least 1.4, such as at least 1.5, a support surface, and a support length (L1), the coating layer is configured on at least part of the support surface over at least part of the support length (L1), wherein the coating layer comprises a coating layer material, a coating layer index of refraction n2, wherein coating layer index of refraction n2 is in specific embodiments at least 1.4, such as at least 1.5, and a coating layer thickness (d1), wherein the coating layer material has a composition different from the support material, wherein the coating layer material comprises a luminescent material configured to absorb one or more of UV radiation and visible light, and to convert into luminescent material light having one or more wavelengths in one or more of the visible and the infrared; and the support material is transmissive for the luminescent material light (and especially also for the one or more of UV radiation and visible light), and in specific embodiments (at one or more wavelengths of the luminescent material light) $-0.2 \leq n1-n2 \leq 0.2$, and especially $-0.1 \leq n1-n2 \leq 0.1$, may apply. Optionally, also $d1/P \leq 0.25$ may apply, such as $d1/P \leq 0.20$ wherein the elongated luminescent body comprising one or more side faces, wherein the elongated luminescent body comprises a radiation input face and a radiation exit window, wherein the radiation input face is configured in a light receiving relationship with the plurality of light sources, wherein the luminescent material is configured to absorb at least part of the light source light and convert into the luminescent material light, and wherein the radiation input face is configured perpendicular to the light exit window.

Such elongated luminescent body can be used to concentrate light (see also below), whereas production thereof and scalability thereof may be much easier than for singly crystalline based elongated luminescent bodies. Further, with such elongated luminescent body the possible problem of the maximum cerium concentration in a single crystalline body may be lifted, as cerium comprising luminescent material (and/or another luminescent material) may be applied in a coating. This coating, however, is not necessarily single crystalline. In contrast, it can be glassy or polycrystalline, but the coating can also be an organic material based coating layer, such as a polymeric based coating layer, or a silicone based coating layer. Further, with such elongated body, it may also be possible to select types of luminescent materials that are not possible with single crystalline or ceramic luminescent bodies. Hence, also the degrees of freedom to produce the elongated luminescent body are larger, allowing a more versatile set of optical solutions.

As indicated above, the invention provides a luminescent body, especially an elongated luminescent body. The luminescent body has a body axis or "axis of elongation". The "term" elongated is applied, as the length may be longer than the diameter, or as the length may be longer than a width and height. Hence, the (elongated) body has a length parameter P of a body dimension perpendicular to the body axis (BA) selected from height (H), width (W) and diameter (D).

Hence, for a length L (along the body axis) of the elongated luminescent body may apply L>H and L>W, or L>D. In embodiments, the length parameter P is selected from the range of 0.5-500, such as 0.5-200, like 0-5-100 mm. In specific embodiments, the length parameter P may be selected from the range of 1-500 mm, such as 1-200 mm. For further aspects of the dimensions, it is further referred to the dimensions and embodiments in relation to the elongated support, as the coating layer is a relative thin layer on at least part of the (elongated) luminescent body (see also below).

Hence, the elongated luminescent body comprises an elongated support and a coating layer.

The (elongated) support ("support") has a support length L1. The support has a first length parameter P1 of a dimension perpendicular to the body axis (BA) selected from first height (H1), a first width (W1) and a first diameter (D1). Hence, for the support length L1 (along the body axis) of the elongated support may apply L1>H1 and L1>W1, or L1>D1. Further, as will be clear from the above H≈H1 and W≈W1, or D≈D1. Further, as will be clear from the above P≈P1. Further, as will also be clear from the above, L≈L1, more especially L=L1, as the end face(s) will in general not be coated with the coating layer.

The term "support surface" especially relates to one or more faces (of the support) that have essentially the same length as the support. Hence, the support surfaces may be surfaces of side faces. In case of e.g. a rectangular cross-section, there may be four side faces, of which a sub-set or all of these side faces may define the support surface. In case of e.g. a circular cross-section, the entire (external) circumferential surface may be the support surface, though in embodiments also only part thereof may be provided with the coating layer.

The support may be hollow or solid. In general, the embodiments described herein relate to solid supports. The support may have a circular, oval, or rectangular (such as square) cross-section. Therefore, the (elongated) luminescent body has a round, oval, or rectangular cross-section perpendicular to the body axis (BA). The support may have a constant cross-section over its support length. However, the support may in embodiments also be tapering over at least part of the support length. Further aspects of the dimensions of the support surface are further described below.

The support comprises a support material having a support material index of refraction n1. The term "support material" may also refer to a combination of materials, such as a blend. The support material may in embodiments comprise one or more of a glass material, a single crystal, a ceramic material, and a polymeric material. The polymeric material, see also below, may comprise an organic polymer or e.g. silicone.

Especially, the support material index of refraction n1 is at least 1.4, such as especially at least 1.5, like at least 1.7, such as in embodiments at least 1.8. The higher the index of refraction, the more efficient the luminescent concentrator (see also below) can be. The support material is especially transmissive for one or more wavelengths of the luminescent material light. Suitable materials are described below. The index of refraction of the support material may especially refer to the index of refraction at one or more wavelengths of the luminescent material light (see below).

At least part of the support surface may be provided with a coating layer. Assuming e.g. a circular cross-section, the entire circumferential surface may be provided with a coating. However, also a part of the circumferential surface may be provided with the coating. For instance, assuming a symmetry plane of the support, wherein the body axis is within such symmetry plane, only at one side of the symmetry plane the coating layer may be available. However, in other embodiments the coating layer may be available at both sides.

In general, the coating is a uniform coating. Hence, the coating is not defined by a plurality of coating spots, but is a uniform coating. About at least 20%, such as at least 40%, like at least 50%, like at least 80%, such as at least 90%, like essentially 100% of the support surface may be provided with the coating layer. Hence, the coating layer is configured on at least part of the support surface over at least part of the support length (L1).

The coating layer comprises a coating layer material. The term "coating layer material" may also refer to a combination of materials. The coating layer material comprises a luminescent material configured to absorb one or more of UV radiation and visible light, and to convert into luminescent material light having one or more wavelengths in one or more of the visible and the infrared.

In embodiments, the luminescent material comprises an organic dye. In such embodiments, the organic dye may be molecularly dispersed in a matrix material, in general a polymeric material (see examples of suitable polymeric materials below). Alternatively or additionally, the organic dye may be provided as coating layer. Hence, in embodiments a layer of organic dye may be the coating layer.

Layers may be chosen such that a high light absorption in a desired spectral range may be obtained. Hence, in embodiments the coating layer material comprises an organic dye. The term "dye" may also refer to a plurality of different types of dyes.

In embodiments, the luminescent material may comprise quantum dots or other types of inorganic luminescent nanoparticles. Especially, such material may be embedded in a matrix material in general a polymeric material (see examples of suitable polymeric materials below). Hence, in embodiments the coating layer material comprises inorganic luminescent nanoparticles. The term "quantum dots" may also refer to a plurality of different types of quantum dots.

In embodiments the luminescent material may comprise an inorganic luminescent material comprising particles having particle sizes in the micrometer range. Such materials may be embedded in a matrix material, especially in order to create a relatively flat coating layer. Hence, in embodiments the coating layer material may comprise a matrix material and an inorganic luminescent material comprising particles having in embodiments weight averaged particle sizes selected from the range of 0.1-20 μm, embedded in a matrix material, wherein the matrix material is selected from the group consisting of a glass material, a ceramic material, and a polymeric material. Especially, in embodiments the index of refraction of the matrix material and the index of refraction of the luminescent material are essentially the same, in order to prevent scattering. Hence, in embodiments the matrix material has a matrix material index of refraction n21, and wherein the luminescent material has a luminescent material index of refraction n22, wherein $0.05 \leq n21-n22 \leq 0.05$, especially wherein $0.02 \leq n21-n22 \leq 0.02$. In specific embodiments, $-0.01 \leq n21-n22 \leq 0.01$ may apply, or even $-0.005 \leq n21-n22 \leq 0.005$ may apply, or even yet $-0.002 \leq n21-n22 \leq 0.002$. The matrix material and the luminescent material (and optionally further additives) define the coating layer index of refraction. The term "inorganic luminescent material" may also refer to a plurality of different types of inorganic luminescent materials.

Examples of luminescent materials are further elucidated below.

The coating layer has a coating layer index of refraction n2. Especially, the coating layer index of refraction n2 is at least 1.4, such as especially at least 1.5, like at least 1.7, such as in embodiments at least 1.8. The index of refraction of the support material especially refers to the index of refraction at one or more wavelengths of the luminescent material light.

The phrase "at one or more wavelengths of the luminescent material light" may in embodiments e.g. refer to at least the wavelength at a spectral maximum of the luminescent material light (such as in the visible wavelength range). Alternatively, it may in embodiments e.g. refer to the median wavelength of the luminescent material light (such as in the visible wavelength range). Hence, indices of refraction herein especially refer to indices of refraction at one or more wavelengths of the luminescent material light, e.g. the indices of refraction of the median wavelength of the luminescent material light.

The index of refraction of the coating layer is defined by the luminescent material, optional host matrix material, and optional further material. For instance, in embodiments material may be available in the coating layer to tune the index of refraction of the coating layer. In specific embodiments, the coating layer may comprise titania or zirconia (nano)particles (see also below).

Especially, the coating layer material has a composition different from the support material. Especially, the support material does not comprise a luminescent material. Would the luminescent material be comprised by the support material, then in embodiments its concentration (relative to the volume of the support material), would be at maximum $1/1000$, such as at maximum $1/10,000$ of the concentration in the coating layer.

Hence, in embodiments the support material is essentially transmissive, more especially essentially transparent, for the light having (one or more) wavelengths suitable to excite the luminescent material. In specific embodiments, the coating layer material has a first absorption length $L_{A1}$ for one or more excitation wavelengths of the luminescent material, especially in the UV and/or visible light (such as blue light), and the support material has a second absorption length $L_{A2}$ for the one or more excitation wavelengths of the luminescent material, wherein $L_{A2}/L_{A1} \geq 20$, like as $L_{A2}/L_{A1} \geq 100$ such as $L_{A2}/L_{A1} \geq 500$, like especially $L_{A2}/L_{A1} \geq 1000$. Hence, in specific embodiments the support material is transmissive for the luminescent material light and for the one or more of UV radiation and visible light. However, in embodiments wherein the first absorption length is smaller than the coating layer width, the support material is not necessarily essentially transmissive for light having (one or more) wavelengths suitable to excite the luminescent material.

The coating layer has a coating layer thickness (d1). As indicated above, this thickness is especially essentially uniform over the coating layer. Especially, the coating layer has essentially a uniform coating height or coating thickness. In embodiments, the coating layer thickness (d1) is selected from the range of up to 100 μm. Coating layers comprising quantum dots may e.g. in embodiments have smaller thicknesses, such as up to about 20 μm, like up to about 15 μm.

As indicated above, especially $d1/P \leq 0.25$. Reference d1 refers to the coating thickness, and P indicates the length parameter of a body dimension perpendicular to the body axis BA, wherein the length parameter P may be selected from height H, width W and diameter D. In the case of an elongated luminescent body having a circular cross-section, the length parameter P is the diameter D of elongated luminescent body. In the case of an elongated luminescent body having a rectangular cross-section, the length parameter P is the height H or width W of elongated luminescent body, especially the height.

In alternative embodiments, the coating layer comprising the luminescent material is provided with an outer coating layer that is essentially free of luminescent material. Such outer coating layer may have different functions, like passivation, protection, etc. (see also below). Assuming the thickness of all coatings together to be d1*, then (also) $d1*/P \leq 0.25$ may apply.

In order to minimize scattering, it may be desirable that the coating layer is relatively smooth or uniform. Alternatively, a layer on the coating layer, which may especially have essentially the same index of refraction as the coating layer, may be relatively flat. Therefore, in the coating layer, or where available an outer layer configured over the coating layer, has a root mean square height Sq of at maximum $1/10$, like at maximum $1/20$, or even at maximum $1/50$, like at maximum $1/100$, of one or more wavelengths of the luminescent material light. For instance, would an emission maximum of the luminescent material be at about 570 nm, then the root mean square height Sq of the coating layer, or the optional outer layer, may e.g. be at maximum $1/10*570$ nm, i.e. at maximum 57 nm. The parameter Sq or the root mean square height of a surface is known to a person skilled in the art, and is amongst others defined in ISO 25178 (Publication date 2012-04; ISO 25178-2:2012 Geometrical product specifications (GPS)—Surface texture: Areal—Part 2: Terms, definitions and surface texture parameters) or in https://www.keyence.com/ss/products/microscope/roughness/surface/sq-root-mean-square-height.jsp.

As indicated above, especially the indices of refraction of the support material and the coating layer material do not differ too much, such as $-0.2 \leq n1-n2 \leq 0.2$. Especially, the refractive index of the coating layer is essentially equal to (or higher than) the refractive index of the support material, though in embodiments the refractive index of the support material may also be larger than of the coating material. In embodiments $-0.1 \leq n1-n2 \leq 0.1$ may apply.

In specific embodiments, the support material index of refraction n1 is at least 1.75. Further, also especially the coating layer index of refraction n2 is at least 1.75. Yet even more especially, one or more of n1 and n2 are at least 1.8, such as about 1.85 or larger.

As indicated above, it may be desirable to have relatively high indices of refraction in terms of outcoupling of the luminescent material light from the elongated luminescent body. In order to increase the index of refraction e.g. zirconia or titania nanoparticles may be added (see also above). Hence, in specific embodiments one or more of the support material and the coating layer material comprise zirconia or titania (nano)particles. Alternative to or in addition to zirconia and/or titania, one or more of SiC, $PbO_2$, $GeO_2$, $TeO_2$, $HfO_2$, $Ga_2O_3$, $Y_2O_3$, $Lu_2O_3$, $Ta_2O_5$, $Nb_2O_5$, $SrTiO_3$, and $BaTiO_3$. The term zirconia may in embodiments also refer to yttrium stabilized $ZrO_2$. The terms "refractive index" and "index of refraction" refer to the same.

Further, as indicated above the coating layer may in embodiments be thin relative to the support. Especially, in embodiments $d1/P \leq 0.25$, especially $d1/P \leq 0.2$, such as $d1/P \leq 0.1$, may apply, especially for elongated supports having a circular cross-section. For non-circular cross-sections, especially for rectangular cross-sections, $d1/P \leq 0.25$, though a larger ratio is not necessarily excluded.

Further, as indicated above in embodiments the coating layer thickness (d1) is selected from the range of up to 100 μm.

Especially, the support material and the coating material have relative low scattering (for one or more wavelengths of the luminescent material light). Especially, in embodiments the coating layer material (181) has a mean free path MFP for one or more wavelengths of the luminescent material light (8), wherein $MFP \geq MFP_{min}$, where $MFP_{min} = c*L1*d1/P$, and where $c=0.25$.

In specific embodiments, the coating material may have a mean free path (for scattering) of one or more wavelengths of the luminescent material light of at least about 5 mm, such as at least about 10 mm (see also below). Likewise, the support material may have a mean free path (for scattering) of one or more wavelengths of the luminescent material light of at least about 5 mm, such as at least about 10 mm (see also below). Especially, however the support material has a higher mean free path (for scattering) than the coating layer, such as at least 20 mm, like at least 50 mm. Hence, in embodiments the support material has a mean free path for one or more wavelengths of the luminescent material light of at least 50 mm. In embodiments, the mean free path for scattering of the elongated support may especially be at least its length, even more at least about twice its length, like at least three times its length.

In specific embodiments, the support material comprises one or more of a glass material and a polymeric material, and the coating layer material comprises one or more of an organic dye, a glass material, and a polymeric material (like PMMA, PC, polysiloxane, etc.). Especially such embodiments may have desirable optical properties in terms of mean free path (for scattering). In yet other embodiments, the support material comprises a ceramic material (i.e. an (elongated) ceramic body), and the coating layer material comprises one or more of an organic dye, a glass material, and a polymeric material. In yet other embodiments, the support material comprises a ceramic material (i.e. an (elongated) ceramic body), and the coating layer material comprises a ceramic material, configured a ceramic sleeve on the support. For instance, a core-shell rod or beam (with circular or rectangular cross-section) may be provided.

In embodiments, the coating material comprises one or more materials that are different type of materials than the support material, such as coating comprising an organic polymer on a glass support. In other embodiments, the coating material comprises one or more materials that are of the same type as the support material, such as a coating material comprising a cerium doped garnet, and a support material comprising an undoped garnet. As the coating material comprises a luminescent species and the support material may not comprise such species, or at least in embodiments not comprise a species that is substantially excitable (with the light source) at the same wavelength as the luminescent species, the coating layer material and the support material differ by definition.

In an embodiment, the circumferential surface of the elongated luminescent body is partially provided with a coating layer in an amount equal to or less than 60%, preferably equal to or less than 50%, more preferably equal to or less than 40% of the circumferential surface. Hence, the support surface is only partially covered with the coating layer. In an embodiment, the elongated luminescent body has a first surface that comprises the light input face, the elongated luminescent body has a second surface on which the coating layer is configured, and the first surface is opposed to the second surface. The coating layer may be configured relatively close to a heat transfer element or a heat sink, resulting in improved cooling of the elongated luminescent body.

In an embodiment, the elongated support further comprises an elongated core of a material with a thermal conductivity equal to or larger than 20 W m$^{-1}$ K$^{-1}$ and wherein the ratio P2/P1 is equal to or smaller than 0.5, with a length parameter P1 of a body dimension perpendicular to the body axis of the elongated support, length parameter P2 of a body dimension perpendicular to the body axis of the elongated core, and the length parameter P1, P2 is selected from height (H), width (W) and diameter (D). As a result, the cooling of the elongated luminescent body 100 is further improved. In embodiments, the thermal conductivity of the material of the core is equal to or larger than 50 W m$^{-1}$ K$^{-1}$, more preferably equal to or larger than 100 W m$^{-1}$ K$^{-1}$ and most preferably equal to or larger than 150 W m$^{-1}$ K$^{-1}$. In embodiments, the ratio P2/P1 is equal to or smaller than 0.4, even more preferably equal to or smaller than 0.3, most preferably equal to or smaller than 0.2.

Further aspects of the elongated luminescent body are described below.

The elongated luminescent body may have any shape, such as beam (or bar) like or rod like, however especially beam like (cuboid like). The elongated luminescent body, especially the elongated support, might be hollow, like a tube, or might be filled with another material, like a tube filled with water or a tube filled with another solid light transmissive medium. Hence, the elongated luminescent body may also comprise a tube or a plurality of tubes. In embodiments, the tube (or tubes) may be filled with a gas, like air or another gas having higher heat conductivity, such as helium or hydrogen, or a gas comprising two or more of helium, hydrogen, nitrogen, oxygen and carbon dioxide. In embodiments, the tube (or tubes) may be filled with a liquid, such as water or (another) cooling liquid. In specific embodiments, the elongated support is a solid body.

The elongated luminescent body as set forth below in embodiments according to the invention may also be folded, bended and/or shaped in the length direction such that the elongated luminescent body is not a straight, linear bar or rod, but may comprise, for example, a rounded corner in the form of a 90 or 180 degrees bend, a U-shape, a circular or elliptical shape, a loop or a 3-dimensional spiral shape having multiple loops. This provides for a compact elongated luminescent body of which the total length, along which generally the light is guided, is relatively large, leading to a relatively high lumen output, but can at the same time be arranged into a relatively small space. For example, luminescent parts of the elongated luminescent body may be rigid while transparent parts of the elongated luminescent body are flexible to provide for the shaping of the elongated luminescent body along its length direction. The light sources may be placed anywhere along the length of the folded, bended and/or shaped elongated luminescent body.

The invention is not limited to specific embodiments of shapes, neither is the invention limited to embodiments with a single exit window or outcoupling face. Below, some specific embodiments are described in more detail. Would the elongated luminescent body have a circular cross-section, then the width and height may be equal (and may be defined as diameter).

Further, the elongated luminescent body comprising one or more side faces. The number of side faces is herein also indicated with reference N. The elongated luminescent body may especially comprising four side faces, providing a rectangular cross-section (perpendicular to an axis of elongated of the elongated body). However, in other embodiments the elongated luminescent body may also have a circular or oval cross-section.

Especially, the shape of the luminescent body may essentially be defined by the shape of the support.

As will be further elucidated below, the elongated luminescent body may have a length, a width, and a height, or in other embodiments a length and a diameter. The elongated luminescent body may include a radiation exit window. This radiation exit window, which may especially be an end face, may have a first height and a first width, or in other embodiments a diameter.

In many embodiments, as also depicted herein in a number of drawings, the first height of the radiation exit window and the first width of the radiation exit window are (essentially) identical to the height and width of the elongated luminescent body, respectively. Hence, the aspect ratio of the width and height may essentially be the same as the first aspect ratio of the first width and height. Further, in other embodiments, the first diameter of the radiation exit window and the first diameter of the radiation exit window are (essentially) identical to the height and width of the elongated luminescent body, respectively.

The elongated luminescent body has a length (L). Especially, the elongated luminescent body comprises a first face and a second face defining the length (L) of the elongated luminescent body, wherein the second face comprises the radiation exit window.

In embodiments, the (elongated) luminescent body comprising (n) side faces over at least part of the length (L), wherein n≥3. Hence, especially the (elongated) luminescent body has a cross-sectional shape (perpendicular to an axis of elongation) that is square (n=4), rectangular (n=4), hexagonal (n=6), or octagonal (n=8), especially rectangular. Would the luminescent body have a circular cross-section, N may be considered co.

The (elongated) body includes a first end or first face, in general configured perpendicular to one or more of the (n) side faces, and a second end or second face, which may be configured perpendicular to one or more of the side faces, and thus parallel to the first face, but which also may be configured under an angle unequal to 900 and unequal to 180°.

The (elongated) luminescent body may thus include (n) side faces, which comprise a first side face, comprising a radiation input face, and a second side face configured parallel to the first side face, wherein the side faces define a height (H), or a plurality of side faces defining a diameter (D).

Assuming e.g. a rectangular cross-section (or other types of cross-section with a limited number of side faces, such as up to 8), the first and the second side face are configured parallel with luminescent body material in between, thereby defining the width of the luminescent body.

The radiation input face is at least part of the first face which may be configured to receive the light source light. The (elongated) luminescent body further comprises a radiation exit window bridging at least part of the height (h) between the first side face and the second side face (or diameter). Especially, the radiation exit window is comprised by the second face. Especially, the elongated luminescent body is further configured to provide a single exit window. Further embodiments are also elucidated below.

As the width of the elongated luminescent body may e.g. be over 1.5 mm, such as at least about 2 mm, it may further be possible to arrange more than one solid state light source over the width of the elongated luminescent body. Hence, instead of a single array of solid state light sources, a plurality of arrays, such as (at least) two arrays of solid state light sources may be configured over at least part of the length of the elongated luminescent body, while all these light sources illuminate a single face of the elongated luminescent body. Hence, in embodiments the plurality of light sources is configured in a 2D array. Especially, all light sources are configured in the same plane. As further elucidated below, the light sources are especially solid state light sources, such as LEDs.

In embodiments, the elongated luminescent body may comprise two substantially parallel faces, a radiation input face and opposite thereof the opposite face. These two faces define herein the width of the elongated luminescent body. In general, the length of these faces defines the length of the elongated luminescent body. However, as indicated above, and also below, the elongated luminescent body may have any shape, and may also include combinations of shapes. Especially, the radiation input face has an radiation input face area (A), wherein the radiation exit window has a radiation exit window area (E), and wherein the radiation input face area (A) is at least 1.5 times, even more especially at least two times larger than the radiation exit window area (E), especially at least 5 times larger, such as in the range of 2-50,000, especially 5-5,000 times larger. Hence, especially the elongated luminescent body comprises a geometrical concentration factor, defined as the ratio of the area of the radiation input faces and the area of the radiation exit window, of at least 1.5, such as at least 2, like at least 5, or much larger (see above). This allows e.g. the use of a plurality of solid state light sources (see also below). For typical applications like in automotive, digital projectors, or high brightness spot light applications, a small but high radiant flux or luminous flux emissive surface is desired. This cannot be obtained with a single LED, but can be obtained with the present light generating system. Especially, the radiation exit window has a radiation exit window area (E) selected from the range of 1-100 mm$^2$. With such dimensions, the emissive surface can be small, whereas nevertheless high radiance or luminance may be achieved. As indicated above, the elongated luminescent body in general has an aspect ratio (of length/width). This allows a small radiation exit surface, but a large radiation input surface, e.g. irradiated with a plurality of solid-state light sources. The elongated luminescent body is thus especially an integral body, having the herein indicated faces.

In specific embodiments, the elongated luminescent body may especially have an aspect ratio larger than 1, i.e. the length is larger than the width (or the height). In general, the elongated luminescent body is a rod, or bar (beam), or a rectangular plate, though the elongated luminescent body does not necessarily have a square, rectangular or round cross-section. Hence, in embodiments the elongated luminescent body further has a height (H) and a height (H), with especially L>W and L>H. Especially, the first face and the second face define the length, i.e. the distance between these faces is the length of the elongated luminescent body. These faces may especially be arranged parallel. Or, in other embodiments, L>D.

The generally rod shaped or bar shaped elongated luminescent body can have any cross-sectional shape, but in embodiments has a cross section the shape of a square, rectangle, round, oval, triangle, pentagon, or hexagon. Hence, in some instances (see also above) the term "width" may also refer to diameter, such as in the case of an elongated luminescent body having a round cross section.

Further, in a specific embodiment the length (L) is at least 1 cm, such as selected from the range of 1-100 cm, such as especially at least 2 cm, such as especially 2-50 cm, like at least 3 cm, like 3-20 cm, such as 4-20 cm, or such as 5-50 cm. Other dimensions may, however, also be possible, such as e.g. 0.5-2 cm. In embodiments, the length (L) is at maximum 30 cm, such as at maximum 15 cm. In embodiments, the elongated luminescent body has a height (H) or diameter selected from the range of 0.03-4 cm, especially 0.05-2 cm, such as 0.1-1.5 cm, like 0.1-1 cm.

The elongated luminescent body especially comprises an elongated support and the coating layer. Hence, in embodiments the elongated luminescent body comprises the elongated support. Especially, the elongated support, but especially also the coating layer is transmissive for one or more wavelengths of the luminescent material light.

The support has light guiding or wave guiding properties. Hence, the support may herein also be indicated as waveguide or light guide or light transmissive body. As the support is used as light concentrator, the support is herein also indicated as light concentrator. The support will in general have (some) transmission of one or more of (N)UV, visible and (N)IR radiation, such as in embodiments at least visible light, in a direction perpendicular to the length of the support. Without the activator (dopant) such as trivalent cerium, the internal transmission in the visible might be close to 100%.

The transmission of the support for one or more luminescence wavelengths may be at least 80%/cm, such as at least 90%/cm, even more especially at least 95%/cm, such as at least 98%/cm, such as at least 99%/cm. This implies that e.g. a 1 cm$^3$ cubic shaped piece of support, under perpendicular irradiation of radiation having a selected luminescence wavelength (such as a wavelength corresponding to an emission maximum of the luminescence of the luminescent material of the support), will have a transmission of at least 95%.

Herein, values for transmission especially refer to transmission without taking into account Fresnel losses at interfaces (with e.g. air). Hence, the term "transmission" especially refers to the internal transmission. The internal transmission may e.g. be determined by measuring the transmission of two or more bodies having a different width over which the transmission is measured. Then, based on such measurements the contribution of Fresnel reflection losses and (consequently) the internal transmission can be determined. Hence, especially, the values for transmission indicated herein, disregard Fresnel losses.

In embodiments, an anti-reflection coating may be applied to the luminescent body, such as to suppress Fresnel reflection losses (during the light incoupling process).

In addition to a high transmission for the wavelength(s) of interest, also the scattering for the wavelength(s) may especially be low. Hence, the mean free path for the wavelength of interest only taking into account scattering effects (thus not taking into account possible absorption (which should be low anyhow in view of the high transmission), may be at least 0.5 times the length of the body, such as at least the length of the body, like at least twice the length of the body. For instance, in embodiments the mean free path only taking into account scattering effects may be at least 5 mm, such as at least 10 mm. The wavelength of interest may especially be the wavelength at maximum emission of the luminescence of the luminescent material. The term "mean free path" is especially the average distance a ray will travel before experiencing a scattering event that will change its propagation direction.

In embodiments, the coating may be in the form of a thin slab of luminescent material (e.g. made by tape casting) that is applied on the support (e.g. by gluing). This may especially be suitable when the support has side faces that are essentially flat, such as a support having a rectangular cross-section. Alternatively, it can be applied from a liquid solution (e.g. by dip coating) or dispersion (e.g. using a doctor blade) or from the gas phase (e.g. by ALD (atomic layer deposition)). Alternatively, it can be applied by spray coating. In embodiments, the coating may be provided as glass coating, on a higher melting support, such as a glass coating on a garnet. In embodiments, the support and the coating may be provided by co-sintering. For instance, material that may sinter and which comprises the luminescent material, may be sintered on a support.

In embodiments the elongated luminescent body may be associated to a light extraction body or may form a monolithic body with a light extraction body. The light extraction body may be a collimator, a lens, etc. For instance, in embodiments the light extraction body may comprise a half-sphere (especially with larger diameter than that of the elongated luminescent body assuming such body having a circular cross-section) that is connected to the elongated luminescent body.

It may be desirable to collimate the luminescent material light that escapes from the elongated luminescent body. Hence, in embodiments the elongated luminescent body may be associated to a collimator or may form a monolithic body with a collimator. Embodiments of collimators are further described below.

In yet a further aspect, the invention also provides a light generating system comprising: (i) a plurality of light sources configured to provide light source light; and (ii) the (elongated) luminescent body as defined herein, wherein the (elongated) luminescent body comprises one or more side faces, wherein the (elongated) luminescent body comprises a radiation input face and a radiation exit window, wherein the radiation input face is configured in a light receiving relationship with the plurality of light sources, and wherein the luminescent material configured to absorb at least part of the light source light and convert into the luminescent material light.

The (elongated) luminescent body has an outer surface defined by the coating layer or an outer layer over the coating layer. At least part of the surface defined by the coating layer or an outer layer over the coating layer comprises the radiation input face.

In general, the light source is configured to irradiate one (or more) of the longer faces (side edge), herein indicated as radiation input face, and radiation escapes from a face at a front (front edge), herein indicated as radiation exit window, of the elongated luminescent body. The light source(s) may provide radiation to one or more side faces, and optionally an end face. Hence, there may be more than one radiation input face.

In embodiments, the light sources may be configured at one face of the elongated luminescent body, and at the opposite face, a reflector is available to reflect light source light that has travelled through the elongated luminescent body and escapes at the opposite face, back into the luminescent body. Therefore, in embodiments the elongated luminescent body is configured over at least part of its length (L) between the plurality of light sources and a reflector being reflective for at least part of the light source light.

In embodiments, a single side face is illuminated with the light source light when the number of side faces N=4. In embodiments, two opposite side faces are illuminated with the light source light when the number of side faces N=4. In embodiments, the light concentrator may comprise a rectangular bar (rod), capable to convert blue light into green or yellow light and to collect this green or yellow light (in a small étendue output beam). The rectangular bar may have six surfaces, four large surfaces over the length of the bar forming the four side walls, and two smaller surfaces at the end of the bar, with one of these smaller surfaces forming the "nose" where the desired light is extracted.

In embodiments, a single side of the elongated luminescent body is illuminated with the light source light when the cross-section of the elongated luminescent body is circular. In embodiments, two opposite sides of the elongated luminescent body are illuminated with the light source light when the cross-section of the elongated luminescent body is circular.

The term "light generating device" especially refers to the combination of the elongated luminescent body and light sources, optionally in combination with one or more reflectors (see also below), and/or optionally in combination with a collimator, such as a compound parabolic concentrator or similar concentrator.

The light sources are especially radiationally coupled with the luminescent body, though in general the light sources are not in physical contact with the luminescent body (see also below). As the luminescent body is a body and as in general also the optical element is a body, the term "window" herein may especially refer to side or a part of a side. Hence, the luminescent body comprises one or more side faces, wherein the optical element is configured to receive at the radiation entrance window at least part of the converter radiation that escapes from the one or more side faces.

This radiation may reach the entrance window via a gas, such as air directly. Also the radiation may be delivered via another interface material such as a liquid or transparent solid interface material. Additionally or alternatively, this radiation may reach the entrance window after one or more reflections, such as reflections at a mirror positioned nearby the luminescent body. Hence, in embodiments the light generating system may further comprise a first reflective surface, especially configured parallel to one or more side faces, and configured at a first distance from the luminescent body, wherein the first reflective surface is configured to reflect at least part of the converter radiation that escapes from the one or more side faces back into the luminescent body or to the optical element. The space between the reflective surface and the one or more side faces comprises a gas, wherein the gas comprises air. The first distance may e.g. be in the range of 0.1 µm-20 mm, such as in the range of 1 µm-10 mm, like 2 µm-10 mm.

Especially, the distance is at least wavelength of interest, more especially at least twice the wavelength of interest. Further, as there may be some contact, e.g. for holding purposes or for distance holder purposes, especially an average distance is at least $\lambda_i$, such as at least $1.5*\lambda_i$, like at least $2*\lambda_i$, such as especially about $5*\lambda_i$, wherein $\lambda_i$ is the wavelength of interest. Especially, however, the average distance is in embodiments not larger than 50 µm, such as not larger than 25 µm, like not larger than 20 µm, like not larger than 10 µm, for purposes of good thermal contact. Likewise, such average minimum distance may apply to a reflector and/or optical filter configured at e.g. an end face, or other optical components as well. Optionally, in embodiments an element may comprise both heat sinking function a reflection function, such as a heat sink with a reflective surface, or a reflector functionally coupled to a heat sink.

The light generating system may be configured to provide blue, green, yellow, orange, or red light, etc. Alternatively or additionally, in embodiments, the light generating system may (also) be configured to provide one or more of UV, such as near UV/blue (especially in the range of 320-400 nm), and IR, such as near IR (especially in the range of 750-3000 nm). Further, in specific embodiment, the light generating system may be configured to provide white light. If desired, monochromaticity may be improved using optical filter(s). The definitions of near UV and near infrared may partly overlap with the generally used definition for visible light, which is 380-780 nm.

The term "light concentrator" or "luminescent concentrator" is herein used, as one or more light sources irradiate a relative large surface (area) of the light converter, and a lot of converter radiation may escape from a relatively small area (exit window) of the light converter. Thereby, the specific configuration of the light converter provides its light concentrator properties. Especially, the light concentrator may provide Stokes-shifted light, which is Stokes shifted relative to the pump radiation. Hence, the term "luminescent concentrator" or "luminescent element" may refer to the same element, especially an elongated luminescent body (comprising a luminescent material), wherein the term "concentrator" and similar terms may refer to the use in combination with one or more light sources and the term "element" may be used in combination with one or more, including a plurality, of light sources. When using a single light source, such light source may e.g. be a laser, especially a solid state laser (like a LED laser).

The light generating system may comprise a plurality of luminescent concentrators, such as in the range of 2-50, like 2-20 light concentrators (which may e.g. be stacked).

The light concentrator may radiationally be coupled with one or more light sources, especially a plurality of light sources, such as 2-1000, like 2-50 light sources. The term "radiationally coupled" especially means that the light source and the light concentrator are associated with each other so that at least part of the radiation emitted by the light source is received by the light concentrator (and at least partly converted into luminescence). Instead of the term "luminescence" also the terms "emission" or "emission radiation" may be applied.

Hence, the luminescent concentrator receives at one or more radiation input faces radiation (pump radiation) from an upstream configured light concentrator or from upstream configured light sources. Further, the light concentrator comprises a luminescent material configured to convert at least part of a pump radiation received at one or more radiation input faces into luminescent material radiation, and the luminescent concentrator configured to couple at least part of the luminescent material radiation out at the radiation exit window as converter radiation. This converter radiation is especially used as component of the light generating system light.

The phrase "configured to provide luminescent material radiation at the radiation exit window" and similar phrases especially refers to embodiments wherein the luminescent material radiation is generated within the luminescent concentrator (i.e. within the coating layer of the elongated luminescent body), and part of the luminescent material radiation will reach the radiation exit window and escape from the luminescent concentrator. Hence, downstream of the radiation exit window the luminescent material radiation is provided. The converter radiation, downstream of the radiation exit window comprises at least the luminescent material radiation escaped via the radiation exit window from the light converter. Instead of the term "converter radiation" also the term "light concentrator light" may be used. Pump radiation can be applied to a single radiation input face or a plurality of radiation input faces.

Embodiments of the light sources and/or the elongated luminescent body are also further elucidated below.

In yet a further aspect, the invention also provides a projection system comprising the light generating system as defined herein. The light projector system may also include a plurality of such light generating systems. In yet also a further aspect, the invention also provides a luminaire comprising the system as defined herein. The luminaire may also include a plurality of such light generating systems. In yet also a further aspect, the invention also provides a lamp comprising the system as defined herein. A lamp may in embodiments be socketable.

The projector system (or light generating system) may be configured to provide (at least) three different colors, such as blue, green, and red. Assuming e.g. a cerium based garnet, the luminescence generated by the elongated luminescent body may comprise green and red, which may be separated from each other with the aid of a color wheel and/or with the aid of another color separation optics, like one or more dichroic mirrors.

Here, the term "light generating system" may also be used for a (digital) projector. Further, the light generating system may be used for e.g. stage lighting (see further also below), or architectural lighting, or be applied in a (fluorescence) microscopy or endoscopy light generating system. Therefore, in embodiments the invention also provides a light generating system as defined herein, wherein the light generating system comprises a digital projector, a stage light generating system or an architectural light generating system. The light generating system may comprise one or more light generating systems as defined herein and optionally one or more second light generating systems configured to provide second light generating system light, wherein the light generating system light comprises (a) one or more of (i) the converter radiation as defined herein, and optionally (b) second light generating system light. Hence, the invention also provides a light generating system configured to provide visible light, wherein the light generating system comprises at least one light generating system as defined herein. For instance, such light generating system may also comprise one or more (additional) optical elements, like one or more of optical filters, collimators, reflectors, wavelength converters, lens elements, etc. The light generating system may be, for example, a light generating system for use in an automotive application, like a headlight. Hence, the invention also provides an automotive light generating system configured to provide visible light, wherein the automotive light generating system comprises at least one light generating system as defined herein and/or a digital projector system comprising at least one light generating system as defined herein. Especially, the light generating system may be configured (in such applications) to provide red light. The automotive light generating system or digital projector system may also comprise a plurality of the light generating systems as described herein.

Alternatively, the light generating system may be designed to provide high intensity UV radiation, e.g. for 3D printing technologies or UV sterilization applications. Alternatively, the light generating system may be designed to provide a high intensity IR light beam, e.g., to project IR images for (military) training purposes.

The term white light herein, is known to the person skilled in the art. It especially relates to light having a correlated color temperature (CCT) between about 2000 and 20000 K, especially 2700-20000 K, for general lighting especially in the range of about 2700 K and 6500 K, and for backlighting purposes especially in the range of about 7000 K and 20000 K, and especially within about 15 SDCM (standard deviation of color matching) from the BBL (black body locus), especially within about 10 SDCM from the BBL, even more especially within about 5 SDCM from the BBL, such as within about 3 SDCM from the BBL.

High brightness light sources may be used in e.g. front projectors, rear projectors, studio lighting, stage lighting, entertainment lighting, automotive front lighting, architectural lighting, augmented illumination (incl. data/content), microscopy, metrology, medical applications, e.g. digital pathology, etc.

Further embodiments of the light generating system and/or the projector system are further elucidated below.

Especially, the light generating system comprises a light source configured to provide light source light. The light source is especially a solid state light source, such as a LED or laser diode (LD). The light source especially provides light source light having a peak maximum at or close to the excitation maximum of the luminescent material. Therefore, in embodiments wherein the luminescent material has an excitation maximum $\lambda_{xm}$, wherein the light sources are configured to provide the source light with an intensity maximum $\lambda_{px}$, wherein $\lambda_{xm}-25$ nm$\leq\lambda_{px}\leq\lambda_{xm}+25$ nm, like such as $\lambda_{xm}-15$ nm$\leq\lambda_{px}\leq\lambda_{xm}+15$ nm, especially $\lambda_{xm}-10$ nm$\leq\lambda_{px}\leq\lambda_{xm}+10$ nm, especially wherein $\lambda_{xm}-5$ nm$\leq\lambda_{px}\leq\lambda_{xm}+5$ nm, such as wherein $\lambda_{xm}-2.5$ nm$\leq\lambda_{px}\leq\lambda_{xm}+2.5$ nm. Especially, the light source wavelength is at wavelengths with at least an (excitation) intensity of 50% of the excitation maximum (intensity), such as at least 75% of the excitation maximum (intensity), such as at least 90% of the excitation maximum (intensity) (of the excitation maximum of the luminescent material).

In general, the light source is configured with its optical axis perpendicular to a plane perpendicular to a plane parallel to the body axis, even more especially, the light source is configured with its optical axis perpendicular to the body axis.

Especially, the light source is configured with its optical axis perpendicular to a first side face, especially perpendicular the radiation input face (see further also below). Further, especially a plurality of light sources is applied. Hence, in specific embodiments the light sources have optical axes configured perpendicular to the first side face, especially perpendicular the radiation input face.

The plurality of light sources is configured to provide light source light. At least part of the light source light is absorbed by the luminescent body and converted into luminescent material light. To this end, the luminescent body comprises a radiation input face, wherein the radiation input face is configured in a light receiving relationship with the plurality of light sources. Hence, the light sources and the luminescent body are configured such that during operation at least part of the light source light enters the luminescent body (and is converted thereby). Further, as indicated above the elongated luminescent body comprises luminescent material (in the coating layer) configured to convert at least part of light source light (received at the radiation input face) into luminescent material light. The luminescent material light may escape from the luminescent body. Especially, for instance by using one or more reflectors at one or more sides and/or faces of the luminescent body, the luminescent material light may especially escape from the luminescent body at one face. This face, here below also indicated as second face, may comprise a radiation exit window. In embodiments, the second face is the radiation exit window.

Especially, in embodiments the solid state light source, or other light source, is not in (direct) physical contact with the elongated luminescent body.

Physical contact (between the light exit window(s) of the light source(s) and the light entrance window(s) of the elongated luminescent body/bodies) may lead to undesired outcoupling (from the elongated luminescent body) and thus a reduction in concentrator efficiency. Hence, especially there is substantially no physical contact. If the actual contact area is kept small enough, the optical impact may be negligible or at least acceptable. Therefore, it may be perfectly acceptable to have some physical contact, e.g. by some small points as resulting from a certain surface roughness, or non-perfectly flat surface, or by some intentionally created "highest spots" on a surface that will define a certain average distance between the two surfaces that don't extract substantial amounts of light while enabling a short average distance.

As indicated above, the light generating system may comprise a plurality of light sources. These pluralities of light sources may be configured to provide light source light to a single side or face or to a plurality of faces; see further also below. When providing light to a plurality of faces, in general each face will receive light of a plurality of light sources (a subset of the plurality of light sources). Hence, in embodiments a plurality of light sources will be configured to provide light source light to a radiation input face. Also, this plurality of light sources will in general be configured in a row or a plurality of rows. Hence, the elongated luminescent body is elongated, the plurality of light sources may be configured in a row, which may be substantially parallel to the axis of elongated of the elongated luminescent body. The row of light sources may have substantially the same length as the elongated luminescent body. Hence, in the elongated luminescent body has a length (L) in the range of about 80-120% of the second length of the row of light sources; or the row of light sources has a length in the range of about 80-120% of the length of the elongated luminescent body.

The light sources may be configured to provide light with a wavelength selected from the range of UV (including near UV), visible, and infrared (including near IR).

Especially, the light sources are light sources that during operation emit (light source light) at least light at a wavelength selected from the range of 200-490 nm, especially light sources that during operation emit at least light at wavelength selected from the range of 360-490 nm, such as 400-490 nm, even more especially in the range of 430-490 nm, such as 440-490 nm, such as at maximum 480 nm. This light may partially be used by the luminescent material. Hence, in a specific embodiment, the light source is configured to generate blue light. In a specific embodiment, the light source comprises a solid state light source (such as a LED or laser diode). The term "light source" may also relate to a plurality of light sources, such as e.g. 2-2000, such as 2-500, like 2-100, e.g. at least 4 light sources, such as in embodiments especially 4-80 (solid state) light sources, though many more light sources may be applied. Hence, in embodiments 4-500 light sources may be applied, like e.g. 8-200 light sources, such as at least 10 light sources, or even at least 50 light sources. The term "light source" may also relate to one or more light sources that are tailored to be applied for such light concentrating luminescent concentrators, e.g. one or more LED's having a long elongated radiating surface matching the long elongated light input surfaces of the elongated luminescent concentrator. Hence, the term LED may also refer to a plurality of LEDs. Hence, as indicated herein, the term "solid state light source" may also refer to a plurality of solid state light sources. In an embodiment (see also below), these are substantially identical solid state light sources, i.e. providing substantially identical spectral distributions of the solid state light source radiation. In embodiments, the solid state light sources may be configured to irradiate different faces of the elongated luminescent body. Further, the term "light source" may in embodiments also refer to a so-called chips-on-board (COB) light source. The term "COB" especially refers to LED chips in the form of a semiconductor chip that is neither encased nor connected but directly mounted onto a substrate, such as a PCB ("printed circuit board") or comparable. Hence, a plurality of semiconductor light sources may be configured on the same substrate. In embodiments, a COB is a multi LED chip configured together as a single lighting module.

The light generating system comprises a plurality of light sources. Especially, the light source light of the plurality of light sources have spectral overlap, even more especially, they are of the same type and provide substantial identical light (having thus substantial the same spectral distribution). Hence, the light sources may substantially have the same emission maximum ("peak maximum"), such as within a bandwidth of 10 nm, especially within 8 nm, such as within 5 nm (e.g. obtained by binning). However, in yet other embodiments, the light generating system may comprise a single light source, especially a solid-state light source having a relatively large die. Hence, herein also the phrase "one or more light sources" may be applied.

In embodiments, there may be two or more different luminescent materials, such as e.g. when applying two or more different light transmissive bodies. In such embodiments, the light sources may comprise light sources with two or more different emission spectra enabling excitation of two different luminescent materials. Such two or more different light sources may belong to different bins.

The light sources are especially configured to provide a blue optical power ($W_{opt}$) of at least 0.2 Watt/mm$^2$ to the elongated luminescent body, i.e. to the radiation input face(s). The blue optical power is defined as the energy that is within the energy range that is defined as blue part of the spectrum (see also below). Especially, the photon flux is in average at least $4.5*10^{17}$ photons/(s·mm$^2$), such as at least $6.0*10^{17}$ photons/(s·mm$^2$). Assuming blue (excitation) light, this may e.g. correspond to a blue power ($W_{opt}$) provided to at least one of the radiation input faces of in average at least 0.067 Watt/mm$^2$ and 0.2 Watt/mm$^2$, respectively. Here, the term "in average" especially indicates an average over the area (of the at least one of the radiation input surfaces). When more than one radiation input surface is irradiated, then especially each of these radiation input surfaces receives such photon flux. Further, especially the indicated photon flux (or blue power when blue light source light is applied) is also an average over time.

Furthermore, one may also provide a reflector at the first face (or end face) of the elongated luminescent body. Hence, in embodiments at a backside of the elongated luminescent body, a reflector may be configured. Therefore, in embodiments the light generating system may further comprise a reflector configured to reflect light selected from the group of light source radiation and luminescent material radiation, especially luminescent material radiation, that has escaped from the first face back into the elongated luminescent body, especially at least luminescent material radiation).

For beam shaping, the light generating system may further comprise optics.

In many embodiments, downstream of the elongated luminescent body, a collimator may be configured (see also above). This collimator may be in optical contact with the elongated luminescent body, such as in physical contact. In other embodiments, the collimator may form, together with the elongated luminescent body, a monolithic body (see also above). In such embodiments, wherein a collimator is available, the radiation exit window of the collimator is of relevance, defining the radiation exit window of the light generating device. In such embodiments, the collimator may have a radiation exit window having a first height and a first width. Especially, the aspect ratio of the width and height may essentially be the same as the first aspect ratio of the first width and height. Hence, the radiation exit window of the collimator may essentially have the same aspect ratio as the elongated luminescent body. Hence, in embodiments the light generating system further comprises a collimator configured downstream of the elongated luminescent body, wherein the collimator comprises the radiation exit window.

The terms "upstream" and "downstream" relate to an arrangement of items or features relative to the propagation of the light from a light generating means (here the especially the light source(s)), wherein relative to a first position within a beam of light from the light generating means, a second position in the beam of light closer to the light generating means is "upstream", and a third position within the beam of light further away from the light generating means is "downstream".

As indicated above, the light generating system may comprise a plurality of light sources to provide light source light that is at least partly converted by the elongated luminescent body, more especially the luminescent material of the elongated luminescent body, into converter radiation. The converted light can at least partially escape form the first radiation exit window, which is especially in optical contact with the optical element, more especially the radiation entrance window thereof.

The optical element may especially comprise a collimator used to convert (to "collimate") the light beam into a beam having a desired angular distribution. Further, the optical element especially comprises an elongated luminescent body comprising the radiation entrance window. Hence, the optical element may be a body of light transmissive material that is configured to collimate the converter radiation from the luminescent body.

In specific embodiments, the optical element comprises a compound parabolic like collimator, such as a CPC (compound parabolic concentrator).

A solid collimator, such as a solid CPC, may especially be used as extractor of light and to collimate the (emission) radiation. Alternatively, one may also comprise a dome with optical contact (n>1.00) on the nose of the rod or a hollow collimator, such as a CPC, to concentrate the (emission) radiation.

The optical element may have cross section (perpendicular to an optical axis) with a shape that is the same as the cross-section of the luminescent body (perpendicular to the longest body axis (which body axis is especially parallel to a radiation input face). For instance, would the latter have a rectangular cross section, the former may also have such rectangular cross section, though the dimension may be different. Further, the dimension of the optical element may vary over its length (as it may have a beam shaping function).

Further, the shape of the cross-section of the optical element may vary with position along the optical axis. In a specific configuration, the aspect ratio of a rectangular cross-section may change, especially monotonically, with position along the optical axis. In another preferred configuration, the shape of the cross-section of the optical element may change from round to rectangular, or vice versa, with position along the optical axis.

As indicated above, first radiation exit window (of the elongated luminescent body) is in optical contact with the radiation entrance window of the optical element. The term "optical contact" and similar terms, such as "optically coupled" especially mean that the light escaping the first radiation exit window surface area (A1) may enter the optical element radiation entrance window with minimal losses (such as Fresnel reflection losses or TIR (total internal reflection) losses) due to refractive index differences of these elements. The losses may be minimized by one or more of the following elements: a direct optical contact between the two optical elements, providing an optical glue between the two optical elements, especially the optical glue having a refractive index higher that the lowest refractive index of the two individual optical elements, providing the two optical elements in close vicinity (e.g. at a distance much smaller than the wavelength of the light), such that the light will tunnel through the material present between the two optical elements, providing an optically transparent interface material between the two optical elements, especially the optically transparent interface material having a refractive index higher that the lowest refractive index of the two individual optical elements, the optically transparent interface material might be a liquid or a gel or providing optical Anti Reflection coatings on the surfaces of (one or both of) the two individual optical elements. In embodiments, the optically transparent interface material may also be a solid material. Further, the optical interface material or glue especially may have a refractive index not higher than the highest refractive index of the two individual optical elements.

Hence, in embodiments the light generating system further comprises a collimator configured downstream of the radiation exit window (of the highest order luminescent concentrator) and configured to collimate the converter radiation. Such collimator, like e.g. a CPC (compound parabolic concentrator), may be used to collimate the light escaping from the radiation exit window and to provide a collimated or pre-collimated beam of light. Herein, the terms "collimated", "precollimated" and similar terms may especially refer to a light beam having a solid angle (substantially) smaller than $2\pi$.

Instead of the term "in optical contact" also the terms "radationally coupled" or "radiatively coupled" may be used. The term "radationally coupled" especially means that the luminescent body (i.e. the elongated luminescent body) and the optical element are associated with each other so that at least part of the radiation emitted by the luminescent body is received by the luminescent material. The luminescent body and the optical element, especially the indicated "windows" may in embodiments be in physical contact with each other or may in other embodiments be separated from each other with a (thin) layer of optical glue, e.g. having a thickness of less than about 1 mm, especially less than 100 µm. When no optically transparent interface material is applied, the distance between two elements being in optical contact may especially be about at maximum the wavelength of relevance, such as the wavelength of an emission maximum. For visible wavelengths, this may be less than 1 µm, such as less than 0.7 µm, and for blue even smaller. Hence, to obtain optical contact between two elements for e.g. for light with a wavelength λ, the two elements may be in physical contact or at an average maximum distance of λ, such as at maximum 0.5*λ. Hence, for optical contact herein the distances may be smaller than about 1 µm, like smaller than about 0.7 µm, like smaller than about 0.5 µm, such as at maximum about 0.4 µm (assuming e.g. blue light).

In embodiments, the light generating system comprises a body holder structure. The body holder structure comprises an elongated slit for hosting the elongated luminescent body. Hence, the luminescent body fits in the elongated slit. The body holder structure may comprise a body holder structure length. The slit may have a slit length. The slit length and body holder structure length are essentially the same, i.e. the slit is available over the entire length of the body holder structure. In other embodiments, the slit length may be shorter. In general, however, the slit extends to at least one of the edges of the body holder structure. The slit may be open at least one side. In this way, the elongate body can be provided in the slit in a direction perpendicular to an axis of elongated of the elongated body and the elongated slit. Essentially, the slit has a cross-sectional shape that has the same shape as the luminescent body. For instance, when for instance the luminescent body has a rectangular cross-section shape, the slit will have a shape wherein the rectangular body fits with slit faces parallel to two or more, such as three, side faces of the luminescent body. Hence, the elongated slit is especially configured for hosting the elongated luminescent body.

Especially, only limited physical (or no) contact between the slit side faces and the face of the elongated luminescent body is desirable. By reducing the physical contact, optical radiation losses through evanescent waves may be minimized. Especially, the arrangement is such, that in general the distance between the face and the respective slit side face is large enough to prevent optical contact, such as at least 1 µm, like at least 2 µm (see also below), but small enough to have thermal contact, such as at maximum about 100 µm. This may be achieved by distance holders, using a rough or roughened surface, etc. (see also further below). Hence, in specific embodiments a side face in thermal contact with a slit side face is configured at a first average distance (d11) of at least 1 µm from the slid side face, like at least 2 µm, such as at least 10 µm, up to about 100 µm. Hence, in embodiments the average distance may be selected from the range of $1\ \mu m \le d1 \le 100\ \mu m$, such as $1\ \mu m \le d1 \le 50\ \mu m$, like about $2\ \mu m \le d1 \le 20\ \mu m$. This may apply to each thermal contact between a side face of the elongated luminescent body and a side face of the slit, or other configurations of (other) items that are in thermal contact.

For instance, in embodiments the body holder structure may include an aluminum body with the slit. This may provide good thermal (heat sinking) properties as well as the body may provide reflectance. The aluminum body may be coated to enhance reflectivity and/or improve durability.

Further, the reflector is especially configured at the second side face (and other faces that are not the radiation input face) and configured to reflect light source light escaping from the elongated luminescent body via second face back into the elongated luminescent body. This reflected light may be converted light as well as light source light that is used to illuminate the radiation input face, but that remains unabsorbed during propagation through the luminescent body.

Above, and also below, the heat transfer elements are especially described in relation to the heat transfer of the elongated body. However, the above embodiments may in general also apply to heat transfer element in relation to the light sources (or a substrate with light sources).

Herein, the term "single-sided HLD source" and similar terms may refer to the combination of elongated luminescent body and light sources, wherein the light source illuminates the elongated luminescent body essentially from one side (i.e. one face is irradiated).

On the other hand, in the case of high-power applications, single-sided pumped designs increase the possibility for dedicated luminescent rod cooling separate from the LED-cooling interface, thus e.g. enabling slim form-factor systems.

Parts of the elongated luminescent body that are not used as light incoupling area or light exit window may be provided with a reflector. Hence, in an embodiment the light generating system further comprises a reflector configured to reflect luminescent material radiation (that has escaped from a side of the elongated luminescent body) back into the elongated luminescent body. Therefore, the light generating system may further include one or more reflectors, especially configured to reflect radiation back into the elongated luminescent body that escapes from one or more other faces than the radiation exit window.

The reflector may especially not be in physical contact with the elongated luminescent body. Therefore, in an embodiment an optical reflector may (also) be arranged at faces and/or parts of faces that are not used to couple light source light in or luminescence light out. Especially, such optical reflector may not be in physical contact with the elongated luminescent body. Further, such optical reflector(s) may be configured to reflect one or more of the luminescence and light source light back into the elongated luminescent body. Hence, substantially all light source light may be reserved for conversion by the luminescent material and a substantial part of the luminescence may be reserved for outcoupling from the radiation exit window. The term "reflector" may also refer to a plurality of reflectors.

Especially, such reflectors are also present in the plane where the light sources are positioned, such that that plane consist of a mirror having openings, each opening having the same size as a corresponding light source allowing the light of that corresponding light source to pass the mirror layer and enter the elongated (first) elongated luminescent body while light that traverses from the (first) elongated luminescent body in the direction of that plane receives a high probability to hit the mirror layer and will be reflected by that mirror layer back towards the (first) elongated luminescent body.

The terms "coupling in" and similar terms and "coupling out" and similar terms indicate that light changes from medium (external from the elongated luminescent body into the elongated luminescent body, and vice versa, respectively). In general, the light exit window will be a face (or a part of a face), configured (substantially) perpendicular to one or more other faces of the waveguide. In general, the elongated luminescent body will include one or more body axes (such as a length axis, a width axis or a height axis), with the exit window being configured (substantially) perpendicular to such axis. Hence, in general, the light input face(s) will be configured (substantially) perpendicular to the light exit window. Thus, the radiation exit window is especially configured perpendicular to the one or more radiation input faces. Therefore, especially the face comprising the light exit window does not comprise a light input face.

In specific embodiments, the reflector is (thus) especially configured at a second side face. In embodiments, the elongated luminescent body is configured between light sources at one side and one or more reflectors at another side (with the elongated luminescent body in between).

As in embodiments at least part of the one or more heat transfer elements (see also above) is configured in thermal contact with at least part of the side face, such as the second side face, such reflector may configured between the one or more heat transfer elements or may be comprised by the one or more heat transfer elements.

The one or more reflectors may consist of a metal reflector, such as a thin metal plate or a reflective metal layer deposited on a substrate, such as e.g. glass. The one or more reflectors may consist of an optical transparent body containing optical structure to reflect (part) of the light such as prismatic structures. The one or more reflectors may consist of specular reflectors. The one or more reflectors may contain microstructures, such as prism structures or saw tooth structures, designed to reflect the light rays towards a desired direction.

The reflector may comprise a specular mirror, such as an aluminum (coated) mirror. The reflector may also comprise a diffuse reflector, such as a coating of a metal oxide or other reflective material that is (highly) reflective, especially in the visible (spectral range). Hence, the reflective material may be a specular reflective material, such as an aluminum mirror. The reflective material may also be diffuse reflective material, such as a coating of a particulate white material. Suitable reflective material for reflection in the visible may be selected from the group consisting of $TiO_2$, $BaSO_4$, MgO, $Al_2O_3$, and Teflon.

Especially, all heat transfer element faces (see also above) that face the elongated luminescent body comprise such reflector. When a heat transfer element face comprises a reflector, the shortest distance between the reflector and the luminescent body may be as defined herein (for the shortest distance between the heat transfer element (face) and the luminescent body).

In specific embodiments, the reflector and the heat transfer element may be the same element. The material of the heat transfer element can have good thermal conductance properties and a high optical reflectivity (>90%) in e.g. the visible spectral range. An example of such a material is AlSiMgMn.

The support comprises a light transmissive material.

Suitable materials may comprise one or more materials selected from the group consisting of a transmissive organic material, such as selected from the amorphous polymers group, e.g. PC (polycarbonate), polymethylacrylate (PMA), polymethylmethacrylate (PMMA) (Plexiglas or Perspex), cellulose acetate butyrate (CAB), silicone, PDMS (polydimethylsiloxane), and COC (cyclo olefin copolymer). Especially, the light transmissive material may comprise an aromatic polyester, or a copolymer thereof, such as e.g. polycarbonate (PC), poly (methyl)methacrylate (P(M)MA), polyglycolide or polyglycolic acid (PGA), polylactic acid (PLA), polycaprolactone (PCL), polyethylene adipate (PEA), polyhydroxy alkanoate (PHA), polyhydroxy butyrate (PHB), poly(3-hydroxybutyrate-co-3-hydroxy-valerate) (PHBV), polyethylene terephthalate (PET), polybutylene terephthalate (PBT), polytrimethylene terephthalate (PTT), polyethylene naphthalate (PEN). Hence, the light transmissive material is especially a polymeric light transmissive material.

However, in another embodiment the light transmissive material may comprise an inorganic material. Especially, the inorganic light transmissive material may be selected from the group consisting of glasses, (fused) quartz, sapphire, transmissive ceramic materials (such as garnets, like undoped YAG or LuAG, or spinel, such as magnesium-aluminate spinel), and silicones. Glass ceramic materials may also be applied. Also, hybrid materials, comprising both inorganic and organic parts may be applied. Especially, the light transmissive material comprises one or more of PMMA, transparent PC, or glass.

The support may comprise an elongated ceramic body. For instance, the ceramic material may comprise YAG (i.e. $Y_3Al_5O_{12}$) or LuYAG, which can be indicated as $(Y_{1-x}Lu_x)_3Al_5O_{12}$, where $0 \leq x \leq 1$, such as in embodiments LuAG ($Lu_3Al_5O_{12}$), YGdAG ("$(Y,Gd)_3Al_5O_{12}$"), LuGaAG ($Y_3(Al,Ga)_5O_{12}$), YSO ($Y_2SiO_5$) or BAM ($BaMgAl_{10}O_{17}$) or similar compounds. The term similar compounds especially refer to compounds having the same crystallographic structure but where one or more cations are at least partially replaced with another cation (e.g. Y replacing with Lu and/or Gd, or Ba replacing with Sr). Optionally, also anions may be at least partially replaced, or cation-anion combinations, such as replacing at least part of the Al—O with Si—N.

In embodiments, the ceramic material especially comprises an $A_3B_5O_{12}$ ceramic material ("ceramic garnet"), wherein A comprises yttrium (Y) and/or lutetium (Lu) and/or gadolinium (Gd), and wherein B comprises aluminum (Al) and/or gallium (Ga), especially at least Al. As further indicated below, A may also refer to other rare earth elements and B may include Al only, but may optionally also include gallium. The formula $A_3B_5O_{12}$ especially indicates the chemical formula, i.e. the stoichiometry of the different type of elements A, B and O (3:5:12). However, as known in the art the compounds indicated by such formula may optionally also include a small deviation from stoichiometry.

The support may also be a crystal, such as a single crystal. Such crystals can be grown/drawn from the melt in a higher temperature process. The large crystal, typically referred to as boule, can be cut into pieces to form the light transmissive bodies. The (polycrystalline) garnets mentioned above are examples of materials that can alternatively also be grown in single crystalline form. Hence, examples of materials that can be grown as single crystals are for instance YAG (i.e. $Y_3Al_5O_{12}$) or LuYAG, which can be indicated as $(Y_{1-x}Lu_x)_3Al_5O_{12}$, where $0 \leq x \leq 1$, such as in embodiments LuAG ($Lu_3Al_5O_{12}$), YGdAG ("$(Y,Gd)_3Al_5O_{12}$"), LuGaAG ($Y_3(Al,Ga)_5O_{12}$), YSO ($Y_2SiO_5$) or BAM ($BaMgAl_{10}O_{17}$). Also magnesium-aluminate spinel may be applied as single crystal.

As indicated above, the support may also be a glass, like a high index glass, such as having an index of refraction of at least 1.4, like at least 1.5, such as at least 1.7.

After obtaining the support, the body may be polished. Before or after polishing an annealing process (in an oxidative atmosphere) may be executed, especially before polishing. In a further specific embodiment, the annealing process lasts for at least 2 hours, such as at least 2 hours at least 1200° C. Further, especially the oxidizing atmosphere comprises for example $O_2$.

The luminescent material may comprise an $A_3B_5O_{12}$:$Ce^{3+}$ (garnet material), wherein A is especially selected from the group consisting of Sc, Y, Tb, Gd, and Lu (especially at least Y and/or Lu, and optionally Gd), wherein B is especially selected from the group consisting of Al and Ga (especially at least Al). More especially, A (essentially) comprises (i) lutetium (Lu), (ii) yttrium, (iii) yttrium (Y) and lutetium (Lu), (iv) gadolinium (Gd), optionally in combination with one of the aforementioned, and B comprises aluminum (Al) or gallium (Ga) or a combination of both. Such garnet is be doped with cerium (Ce), and optionally with other luminescent species such as praseodymium (Pr).

As indicated above, the element A may especially be selected from the group consisting of yttrium (Y) and gadolinium (Gd). Hence, $A_3B_5O_{12}$:$Ce^{3+}$ especially refers to $(Y_{1-x}Gd_x)_3B_5O_{12}$:$Ce^{3+}$, wherein especially x is in the range of 0.1-0.5, even more especially in the range of 0.2-0.4, yet even more especially 0.2-0.35. Hence, A may comprise in the range of 50-90 atom % Y, even more especially at least 60-80 atom % Y, yet even more especially 65-80 atom % of A comprises Y. Further, A comprises thus especially at least 10 atom % Gd, such as in the range of 10-50 atom % Gd, like 20-40 atom %, yet even more especially 20-35 atom % Gd.

Especially, B comprises aluminum (Al), however, B may also partly comprise gallium (Ga) and/or scandium (Sc) and/or indium (In), especially up to about 20% of Al, more especially up to about 10% of Al may be replaced (i.e. the A ions essentially consist of 90 or more mole % of Al and 10 or less mole % of one or more of Ga, Sc and In); B may especially comprise up to about 10% gallium. Therefore, B may comprise at least 90 atom % Al. Hence, $A_3B_5O_{12}$:$Ce^{3+}$ especially refers to $(Y_{1-x}Gd_x)_3Al_5O_{12}$:$Ce^{3+}$, wherein especially x is in the range of 0.1-0.5, even more especially in the range of 0.2-0.4.

In another variant, B (especially Al) and O may at least partly be replaced by Si and N. Optionally, up to about 20% of Al—O may be replaced by Si—N, such as up to 10%.

For the concentration of cerium, the indication n mole % Ce indicates that n % of A is replaced by cerium. Hence, $A_3B_5O_{12}:Ce^{3+}$ may also be defined as $(A_{1-n}Ce_n)_3B_5O_{12}$, with n e.g. being in the range of 0.001-0.036, such as 0.0015-0.01. Therefore, a garnet essentially comprising Y and mole Ce may in fact refer to $((Y_{1-x}Gd_x)_{1-n}Ce_n)_3B_5O_{12}$, with x and n as defined above.

Instead of $A_3B_5O_{12}$, the invention may also be applied with another cerium comprising material, such as e.g. $M_2SiO_5:Ce^{3+}$, wherein M refers to one or more elements selected from the group of lanthanides and yttrium, especially wherein M comprises one or more of Y, La, Gd, and Lu. All embodiments described herein may also be applied in relation to such luminescent material. As indicated above, also other types of luminescent materials can be applied, be it other inorganic luminescent materials, quantum dot (inorganic) luminescent materials, or organic dyes.

The terms "light" and "radiation" are herein interchangeably used, unless clear from the context that the term "light" only refers to visible light. The terms "light" and "radiation" may thus refer to UV radiation, visible light, and IR radiation. In specific embodiments, especially for lighting applications, the terms "light" and "radiation" refer to visible light.

The term UV radiation may in specific embodiments refer to near UV radiation (NUV). Therefore, herein also the term "(N)UV" is applied, to refer to in general UV, and in specific embodiments to NUV. The term IR radiation may in specific embodiments refer to near IR radiation (NIR). Therefore, herein also the term "(N)IR" is applied, to refer to in general IR, and in specific embodiments to NIR.

Herein, the term "visible light" especially relates to light having a wavelength selected from the range of 380-780 nm. The transmission can be determined by providing light at a specific wavelength with a first intensity to the elongated luminescent body under perpendicular radiation and relating the intensity of the light at that wavelength measured after transmission through the material, to the first intensity of the light provided at that specific wavelength to the material (see also E-208 and E-406 of the CRC Handbook of Chemistry and Physics, 69th edition, 1088-1989).

The terms "violet light" or "violet emission" especially relates to light having a wavelength in the range of about 380-440 nm. The terms "blue light" or "blue emission" especially relate to light having a wavelength in the range of about 440-490 nm (including some violet and cyan hues). The terms "green light" or "green emission" especially relate to light having a wavelength in the range of about 490-560 nm. The terms "yellow light" or "yellow emission" especially relate to light having a wavelength in the range of about 560-590 nm. The terms "orange light" or "orange emission" especially relate to light having a wavelength in the range of about 590-620. The terms "red light" or "red emission" especially relate to light having a wavelength in the range of about 620-750 nm. The terms "visible" light or "visible emission" refer to light having a wavelength in the range of about 380-750 nm.

Especially, the coating layer thickness, amount of luminescent material, arrangement of light sources, and elongated luminescent body, and optional reflectors, are selected such that more than 70%, especially more than 85%, and if possible more than 95%, of the light source light may be absorbed.

For further improving efficiency and/or for improving the spectral distribution several optical elements may be included like mirrors, optical filters, additional optics, etc.

In specific embodiments, the light generating system may have a mirror configured at the first face configured to reflect light back into the elongated luminescent body, and/or may have one or more of an optical filter, a (wavelength selective) mirror, a reflective polarizer, light extraction structures, and a collimator configured at the second face. At the second face the mirror may e.g. be a wavelength selective mirror or a mirror including a hole. In the latter embodiment, light may be reflected back into the body but part of the light may escape via the hole.

When optical coupling is desired, such as with an optical element, like a CPC or a mixing element, downstream of the (part of the) body where the luminescent material is located, an optically transparent interface material may be applied. In yet other embodiments, when no optically transparent interface material is applied, the average distance between two elements being in optical contact may especially be about at maximum the wavelength of relevance, such as the wavelength of an emission maximum. Hence, when optical contact is desired, there may be physical contact. Even in such embodiments, there may be a non-zero average distance, but then equal to or lower than the wavelength of interest.

In specific embodiments, especially when no optical contact is desired, the average distance may be as indicated above but at a few places, for instance for configuration purposes, there may be physical contact. For instance, there may be contact with the edge faces over less than 10%, such as over less than 5% of the total area of the side faces. Hence, the minimum average distance may be as defined e.g. above and if there is physical contact, this physical contact may be with at maximum 10% of the surface area of the surface with which the element (mirror and/or heat sink) is in physical contact, such as at maximum 5%, like at maximum 2%, even more especially at maximum 1%. For instance, for the side faces an average distance may e.g. be between 2 and 10 μm (the lower limit basically determined as being a few times the wavelength of interest; here, assuming e.g. visible light). This may be achieved by having physical contact (to secure that distance) over less than 1% of the total area of that respective side face.

For instance, a heat sink or a reflector, or the relevant surface may have some protrusions, like a surface roughness, by which there may be contact between the surface and the element, but in average the distance is at least $\lambda_i$ (or more, see also above)(in order to essentially prevent optical contact), but there is physical contact with equal to or less than 10% of the surface of the body (to which the element may be thermally coupled and/or optically not coupled), especially substantially less.

In embodiments, optical elements may be included at one or more of the side faces. In particular, anti-reflection coatings may be applied to enhance coupling efficiency of the (excitation) light source light and/or (wavelength selective) reflection coatings for the converted light.

Downstream of the radiation exit window, optionally an optical filter may be arranged. Such optical filter may be used to remove undesired radiation. For instance, when the light generating system should provide red light, all light other than red may be removed. Hence, in a further embodiment the light generating system further comprises an optical filter configured downstream of the radiation exit window and configured to reduce the relative contribution of undesired light in the converter radiation (downstream of the radiation exit window). For filtering out light source light, optionally an interference filter may be applied.

In yet a further embodiment, especially for (LCD) projector applications using dynamic contrast technologies, such as e.g. described in WO0119092 or US RE42,428 (E1), the plurality of light sources are operated in video signal content controlled PWM pulsed operation with a duty cycle selected from the range of 0.01-80%, such as 0.1-70%.

In yet a further embodiment, especially for (LCD) projector applications using dynamic contrast technologies, such as e.g. described in US patent WO0119092 or U.S. Pat. No. 6,631,995 (B2), the plurality of light sources are operated in video signal content controlled intensity modulated operation with intensity variations selected from the range of 0.1-100%, such as 2-100%.

Hence, in embodiments the elongated body or light generating system may e.g. be applied in a LCD (liquid crystal based) based projector. The elongated body or light generating system may in (other) embodiments also be applied in a DLP (digital light processing) based projector.

The light generating system may further comprise a cooling element in thermal contact with the luminescent concentrator. The cooling element can be a heatsink or an actively cooled element, such as a Peltier element. Further, the cooling element can be in thermal contact with the elongated luminescent body via other means, including heat transfer via air or with an intermediate element that can transfer heat, such as a thermal grease. Especially, however, the cooling element is in physical contact with the elongated luminescent body. The term "cooling element" may also refer to a plurality of (different) cooling elements.

In specific embodiments, there is no physical contact between the heat sink (or cooling elements) and the elongated luminescent body. Especially, the average is at least the intensity averaged wavelength of light that is transmitted by luminescence of luminescent material. In embodiments, the average between the elongated luminescent body and the heatsink or cooling element is at least 1 µm, such as at least 2 µm, like at least 5 µm. Further, for a good heat transfer the average distance between the elongated luminescent body and the heatsink or cooling elements is not larger than 50 µm, such as not larger than 25 µm, like not larger than 20 µm, such as equal to or smaller than 15 µm, like at maximum 10 µm.

Therefore, in embodiments the light generating system may further comprise a heat sink having an average distance to the elongated luminescent body of at least 1 µm, such as at least 2 µm, like especially at least 5 µm, or wherein the heat dissipating element is in physical contact with at maximum 10%, such as at maximum 5% of a total area of the side face(s) of the elongated luminescent body. The average is thus especially not larger than 50 µm. Instead of the term "heat sink" also the term cooling element may be applied.

As indicated above, especially there is an average distance between the elongated luminescent body and the slit side(s). As there are (substantial) parts, or the entire part, of the relevant face of the elongated body, at a distance between the (adjacent) slit face, there may be an air gap in between.

The thickness of the air gap is higher than the wavelength of the light, e.g. higher than 0.1 µm, e.g. higher 0.5 µm, like at least 1 µm, such as at least 2 µm. The elongated luminescent concentrator is secured in the housing by providing small particles between the elongated luminescent concentrator and the housing, such as small spheres or rods having a diameter higher than 0.1 µm, e.g. higher 0.5 µm, like at least 1 µm, such as at least 2 µm, such as at least 5 µm, especially equal to or smaller than 20 µm, such as equal to or smaller than 10 µm (see also above defined average).

Alternatively, the elongated luminescent concentrator may be secured in the housing by providing some surface roughness on the surfaces of the highly thermal conductive housing touching the elongated luminescent concentrator, the surface roughness varying over a depth higher than 0.1 µm, e.g. higher 0.5 µm, like at least 1 µm, such as at least 2 µm, especially not larger than 100 µm, even more especially not larger than 50 µm, like not larger than 20 µm, especially equal to or smaller than about 10 µm.

The density of such spheres, rods or touch points of a rough surface of the highly thermal conductive housing is relatively very small, such that most of the surface area of the elongated luminescent body remains untouched securing a high level of TIR reflections within of the light trapped within the elongated luminescent body.

Further, the light generating system may comprise an optical element, such as a CPC or (other) extraction optical element, which may be configured downstream of the elongated luminescent body, but which in embodiments may be integrated with the elongated luminescent body.

Optionally, between this optical element and the elongated luminescent body, a radiation mixing element may be configured. Hence, a section of the elongated luminescent body of an additional element may be configured that acts as an optical mixing rod (especially not round, but e.g. hexagonal) between the converters and the CPC (or extraction optical element). Alternatively or additionally, the extraction optical element is designed such that it also mixes the light.

Further, the light generating system may comprise one or more holding elements for holding the elongated luminescent body. Especially, these holding elements have contact with the edge faces, but only with a small part thereof to minimize losses of light. For instance, the holding element(s), like clamping device (s) have contact with the edge faces over less than 10%, such as over less than 5% of the total area of the side faces. Further, the light generating system may comprise a heat sink and/or a cooling element. The holding element(s) may be comprised by the heat sink and/or cooling element.

BRIEF DESCRIPTION OF THE DRAWINGS

Embodiments of the invention will now be described, by way of example only, with reference to the accompanying schematic drawings in which corresponding reference symbols indicate corresponding parts, and in which.

The schematic drawings are not necessarily on scale.

DETAILED DESCRIPTION OF THE EMBODIMENTS

A light emitting device according to the invention may be used in applications including but not being limited to a lamp, a light module, a luminaire, a spot light, a flash light, a projector, a (digital) projection device, automotive lighting such as e.g. a headlight or a taillight of a motor vehicle, arena lighting, theater lighting and architectural lighting.

Light sources which are part of the embodiments according to the invention as set forth below, may be adapted for, in operation, emitting light with a first spectral distribution. This light is subsequently coupled into a light guide or waveguide; here the elongated luminescent body. The light guide or waveguide may convert the light of the first spectral distribution to another spectral distribution and guides the light to an exit surface.

Figure 1A:
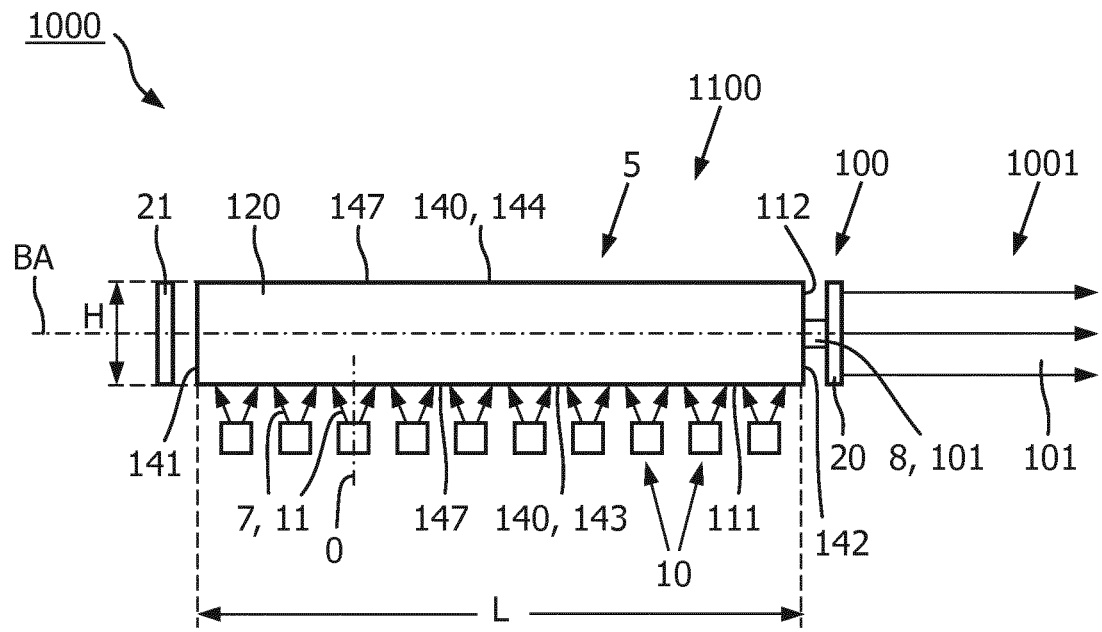
FIGS. 1a-1g schematically depict some aspects of the invention.

An embodiment of the light generating system as defined herein is schematically depicted in FIG. 1a. FIG. 1a schematically depicts a light generating system 1000 comprising a plurality of solid state light sources 10 and a luminescent concentrator 5 comprising an elongated luminescent body 100 having a first face 141 and a second face 142 defining a length L of the elongated luminescent body 100. The elongated luminescent body 100 comprising one or more radiation input faces 111, here by way of example two oppositely arranged faces, indicated with references 143 and 144 (which define e.g. the height H), which are herein also indicated as edge faces or edge sides 147. Further the elongated luminescent body 100 comprises a radiation exit window 112, wherein the second face 142 comprises the radiation exit window 112. The entire second face 142 may be used or configured as radiation exit window. The plurality of solid-state light sources 10 are configured to provide (blue) light source light 11 to the one or more radiation input faces 111. As indicated above, they especially are configured to provide to at least one of the radiation input faces 111 a blue power $W_{opt}$ of in average at least 0.067 Watt/mm². Reference BA indicates a body axis, which will in cuboid embodiments be substantially parallel to the edge sides 147. Reference 140 refers to side faces or edge faces in general.

The elongated luminescent body 100 may comprise a ceramic material 120 configured to wavelength convert at least part of the (blue) light source light 11 into converter light 101, such as at least one or more of green and red converter light 101. As indicated above the ceramic material 120 comprises an $A_3B_5O_{12}$:$Ce^{3+}$ ceramic material, wherein A comprises e.g. one or more of yttrium (Y), gadolinium (Gd) and lutetium (Lu), and wherein B comprises e.g. aluminum (Al). References 20 and 21 indicate an optical filter and a reflector, respectively. The former may reduce e.g. non-green light when green light is desired or may reduce non-red light when red light is desired. The latter may be used to reflect light back into the elongated luminescent body or waveguide, thereby improving the efficiency. Note that more reflectors than the schematically depicted reflector may be used. Note that the elongated luminescent body may also essentially consist of a single crystal, which may in embodiments also be $A_3B_5O_{12}$:$Ce^3$.

The light sources may in principle be any type of light source, but is in an embodiment a solid state light source such as a Light Emitting Diode (LED), a Laser Diode or Organic Light Emitting Diode (OLED), a plurality of LEDs or Laser Diodes or OLEDs or an array of LEDs or Laser Diodes or OLEDs, or a combination of any of these. The LED may in principle be an LED of any color, or a combination of these, but is in an embodiment a blue light source producing light source light in the UV and/or blue color-range which is defined as a wavelength range of between 380 nm and 490 nm. In another embodiment, the light source is an UV or violet light source, i.e. emitting in a wavelength range of below 420 nm. In case of a plurality or an array of LEDs or Laser Diodes or OLEDs, the LEDs or Laser Diodes or OLEDs may in principle be LEDs or Laser Diodes or OLEDs of two or more different colors, such as, but not limited to, UV, blue, green, yellow or red.

The light sources 10 are configured to provide light source light 11, which is used as pump radiation 7. The luminescent material 120 converts the light source light into luminescent material light 8 (see also FIG. 1e). Light escaping at the light exit window is indicated as converter light 101, and will include luminescent material light 8. Note that due to reabsorption part of the luminescent material light 8 within the luminescent concentrator 5 may be reabsorbed. Hence, the spectral distribution may be redshifted relative e.g. a low doped system and/or a powder of the same material. The light generating system 1000 may be used as luminescent concentrator to pump another luminescent concentrator.

Figure 1B:
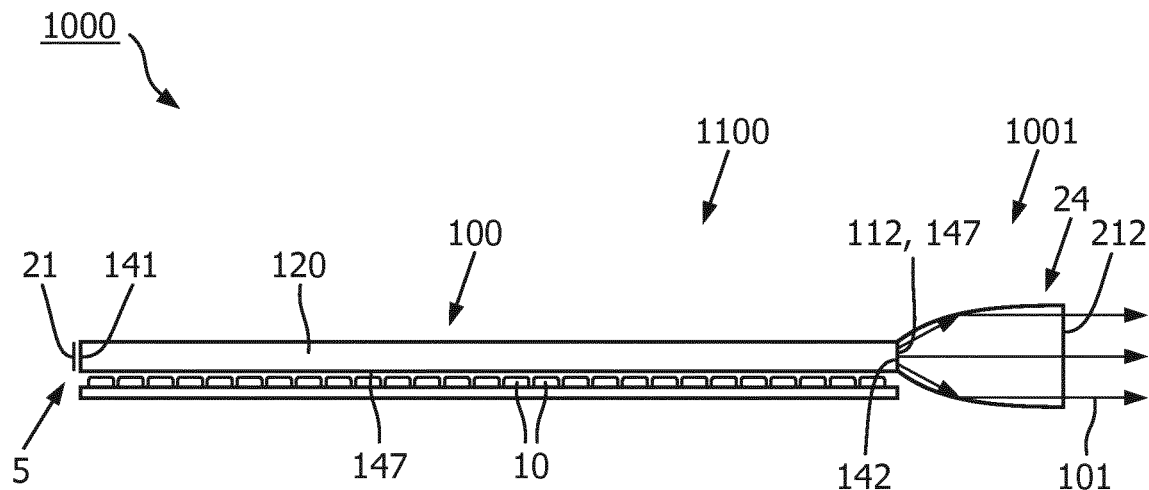

FIGS. 1a-1b schematically depict similar embodiments of the light generating system. Further, the light generating system may include further optical elements, either separate from the waveguide and/or integrated in the waveguide, like e.g. a light concentrating element, such as a compound parabolic light concentrating element (CPC). The light generating systems 1000 in FIG. 1b further comprise a collimator 24, such as a CPC.

As shown in FIGS. 1a-1b and other Figures, the light guide has at least two ends, and extends in an axial direction between a first base surface (also indicated as first face 141) at one of the ends of the light guide and a second base surface (also indicated as second face 142) at another end of the light guide.

Reference 1100 refers to a light generating device comprising the light sources 10 and the elongated luminescent body 100, and optionally the light concentrating element 24. The light generating device has a radiation exit window 112 when there is no light concentrating element 24, and a radiation exit window 212 when there is a light concentrating element 24.

The radiation exit window 112 is in optical contact, such as physical contact, with the light concentrating element 24, such as a CPC like light concentrating element (see also above). The CPC like) light concentrating element 24 has a radiation exit window 212. In embodiments, however, the elongated luminescent body and light concentrating element are essentially a single (monolithic) body. Then, the radiation exit window 212 of the light concentrating element may essentially be the same as the radiation exit window 112 as there is essentially no physical boundary between the elongated luminescent body and the (CPC like) light concentrating element 24.

Figure 1C:
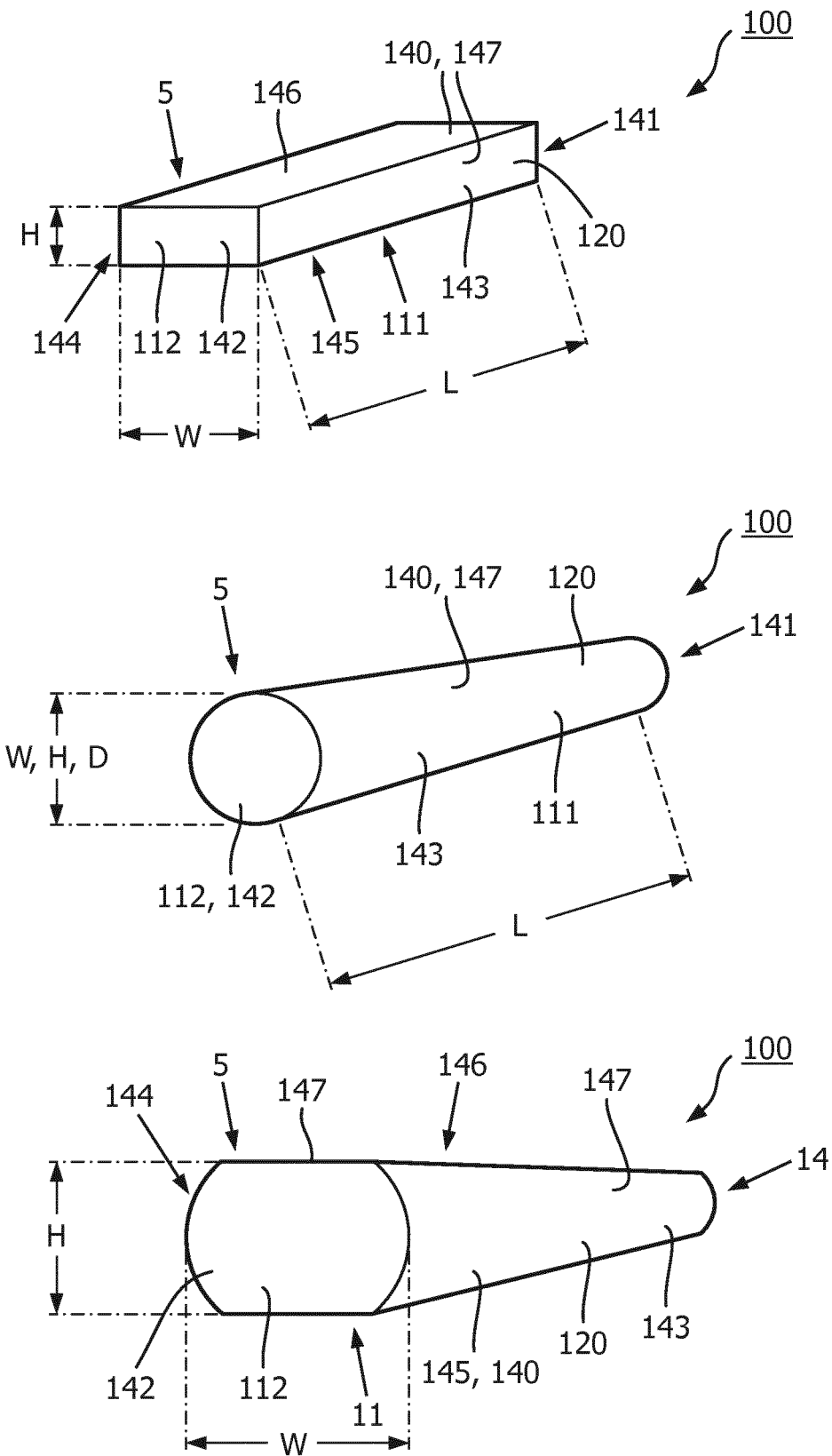

FIG. 1c schematically depicts some embodiments of possible ceramic bodies or crystals as waveguides or luminescent concentrators. The faces are indicated with references 141-146. The first variant, a plate-like or beam-like elongated luminescent body has the faces 141-146. Light sources, which are not shown, may be arranged at one or more of the faces 143-146 (general indication of the edge faces is reference 147). The second variant is a tubular rod, with first and second faces 141 and 142, and a circumferential face 143. Light sources, not shown, may be arranged at one or more positions around the elongated luminescent body. Such elongated luminescent body will have a (substantially) circular or round cross-section. The third variant is substantially a combination of the two former variants, with two curved and two flat side faces. In the embodiment having a circular cross-section the number of side faces may be considered unlimited (Co).

In the context of the present application, a lateral surface of the light guide should be understood as the outer surface or face of the light guide along the extension thereof. For example in case the light guide would be in form of a cylinder, with the first base surface at one of the ends of the light guide being constituted by the bottom surface of the cylinder and the second base surface at the other end of the light guide being constituted by the top surface of the cylinder, the lateral surface is the side surface of the cylinder. Herein, a lateral surface is also indicated with the term edge faces or side 140.

The variants shown in FIG. 1c are not limitative. More shapes are possible; i.e. for instance referred to WO2006/054203, which is incorporated herein by reference. The ceramic bodies or crystals, which are used as light guides, generally may be rod shaped or bar shaped light guides comprising a height H, a width W, and a length L extending in mutually perpendicular directions and are in embodiments transparent, or transparent and luminescent. The light is guided generally in the length L direction. The height H is in embodiments <10 mm, in other embodiments <5 mm, in yet other embodiments <2 mm. The width W is in embodiments <10 mm, in other embodiments <5 mm, in yet embodiments <2 mm. The length L is in embodiments larger than the width W and the height H, in other embodiments at least 2 times the width W or 2 times the height H, in yet other embodiments at least 3 times the width W or 3 times the height H. Hence, the aspect ratio (of length/width) is especially larger than 1, such as equal to or larger than 2, such as at least 5, like even more especially in the range of 10-300, such as 10-100, like 10-60, like 10-20. Unless indicated otherwise, the term "aspect ratio" refers to the ratio length/width. FIG. 1c schematically depicts an embodiment with four long side faces, of which e.g. two or four may be irradiated with light source light.

The aspect ratio of the height H:width W is typically 1:1 (for e.g. general light source applications) or 1:2, 1:3 or 1:4 (for e.g. special light source applications such as headlamps) or 4:3, 16:10, 16:9 or 256:135 (for e.g. display applications). The light guides generally comprise a light input surface and a light exit surface which are not arranged in parallel planes, and in embodiments the light input surface is perpendicular to the light exit surface. In order to achieve a high brightness, concentrated, light output, the area of light exit surface may be smaller than the area of the light input surface. The light exit surface can have any shape, but is in an embodiment shaped as a square, rectangle, round, oval, triangle, pentagon, or hexagon.

Note that in all embodiments schematically depicted herein, the radiation exit window is especially configured perpendicular to the radiation input face(s). Hence, in embodiments the radiation exit window and radiation input face(s) are configured perpendicular. In yet other embodiments, the radiation exit window may be configured relative to one or more radiation input faces with an angle smaller or larger than 90°.

Note that, in particular for embodiments using a laser light source to provide light source light, the radiation exit window might be configured opposite to the radiation input face(s), while the mirror 21 may consist of a mirror having a hole to allow the laser light to pass the mirror while converted light has a high probability to reflect at mirror 21. Alternatively or additionally, a mirror may comprise a dichroic mirror.

Figure 1D:
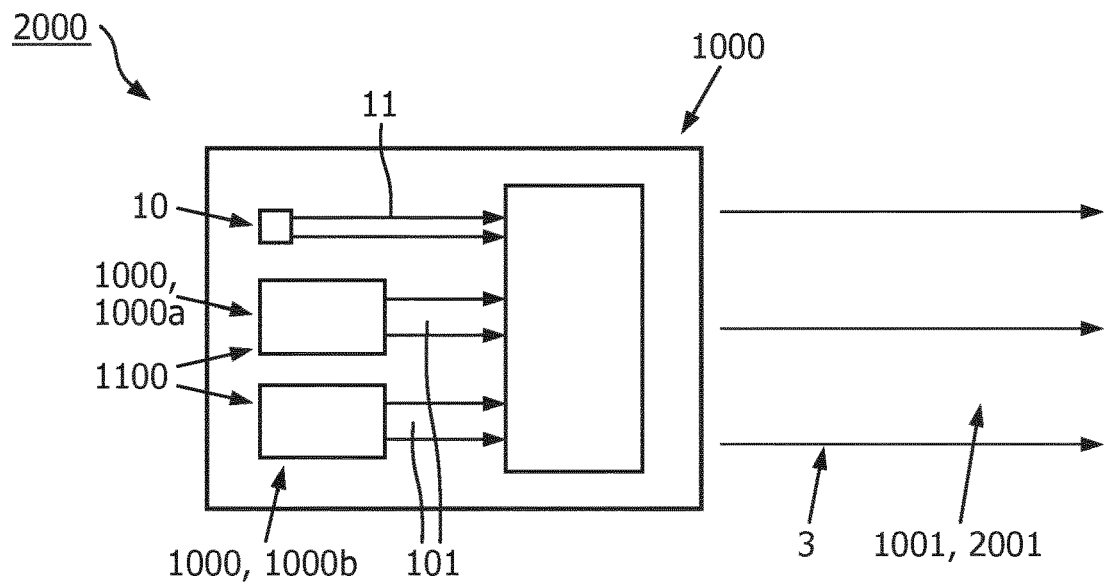

FIG. 1d very schematically depicts a projector or projector device 2000 comprising the light generating system 1000 as defined herein. By way of example, here the projector 2000 comprises at least two light generating systems 1000, wherein a first light generating system 1000a is configured to provide e.g. green light 101 and wherein a second light generating system 1000b is configured to provide e.g. red light 101. Light source 10 is e.g. configured to provide blue light. These light sources may be used to provide the projection (light) 3. Note that the additional light source 10, configured to provide light source light 11, is not necessarily the same light source as used for pumping the luminescent concentrator(s). Further, here the term "light source" may also refer to a plurality of different light sources. The projector device 2000 is an example of a light generating system 1000, which light generating system is especially configured to provide light generating system light 1001, which will especially include light generating system light 101.

High brightness light sources are interesting for various applications including spots, stage-lighting, headlamps and digital light projection.

Figure 1E:
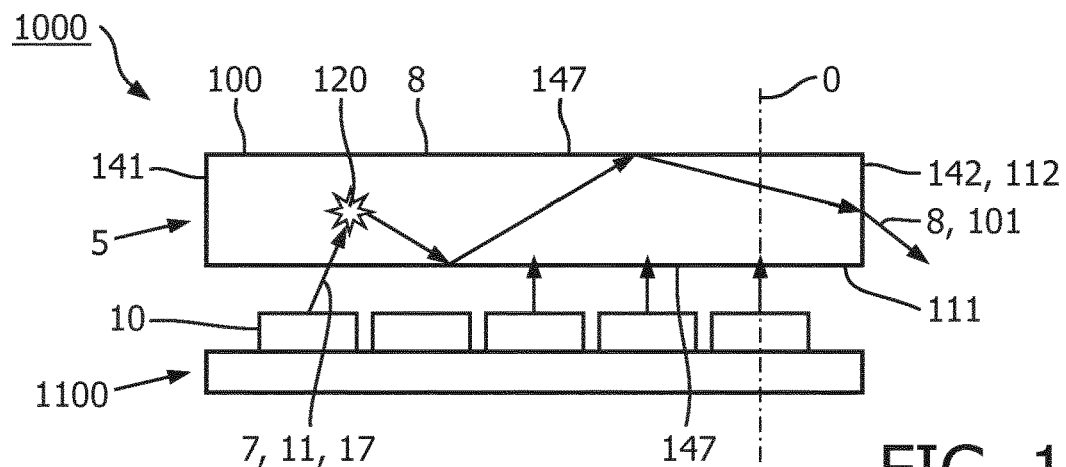

For this purpose, it is possible to make use of so-called luminescent concentrators where shorter wavelength light is converted to longer wavelengths in a highly transparent luminescent material. A rod of such a transparent luminescent material can be used and then it is illuminated by LEDs to produce longer wavelengths within the rod. Converted light which will stay in the luminescent material such as a doped garnet in the waveguide mode and can then be extracted from one of the surfaces leading to an intensity gain (FIG. 1e).

High-brightness LED-based light source for beamer applications appear to be of relevance. For instance, the high brightness may be achieved by pumping a luminescent concentrator rod by a discrete set of external blue LEDs, whereupon the phosphor that is contained in the luminescent rod subsequently converts the blue photons into green or red photons. Due to the high refractive index of the luminescent rod host material (typically 1.8) the converted green or red photons are almost completely trapped inside the rod due to total internal reflection. At the exit facet of the rod the photons are extracted from the rod by means of some extraction optics, e.g. a compound parabolic concentrator (CPC), or a micro-refractive structure (micro-spheres or pyramidal structures). As a result, the high luminescent power that is generated inside the rod can be extracted at a relatively small exit facet, giving rise to a high source brightness, enabling (1) smaller optical projection architectures and (2) lower cost of the various components because these can be made smaller (in particular the, relatively expensive, projection display panel).

Figure 1F:
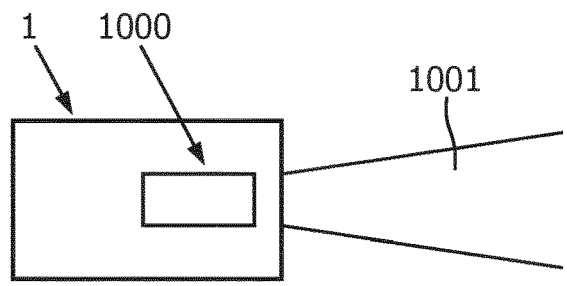

FIG. 1f schematically depicts an embodiment of a luminaire or light generating system 1000 (or other type of lighting device) comprising the light generating system 1000. The luminaire 1200 provide light which may—in a control mode of the luminaire—comprise the lighting generating system light 1001.

Figure 1G:
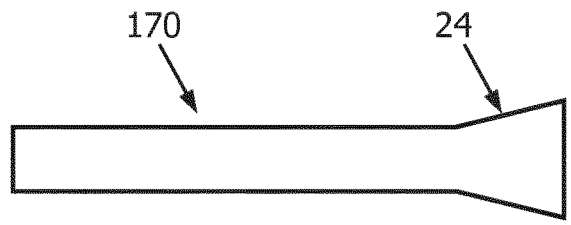

The rod and the collimator 24, such as a CPC, may be made from the same material either in one part, as schematically depicted in FIG. 1g or of different parts, as schematically depicted in FIG. 1b. The support and the collimator 24 may e.g. manufactured by pressing glass or molding of silicone. Reference 170 indicates the support (without coating layer). When the support and collimator, such as the CPC 24, are separate parts, they may especially also be of the same material. This may allow an easy gluing or direct-bonding of the connection.

Figure 2A:
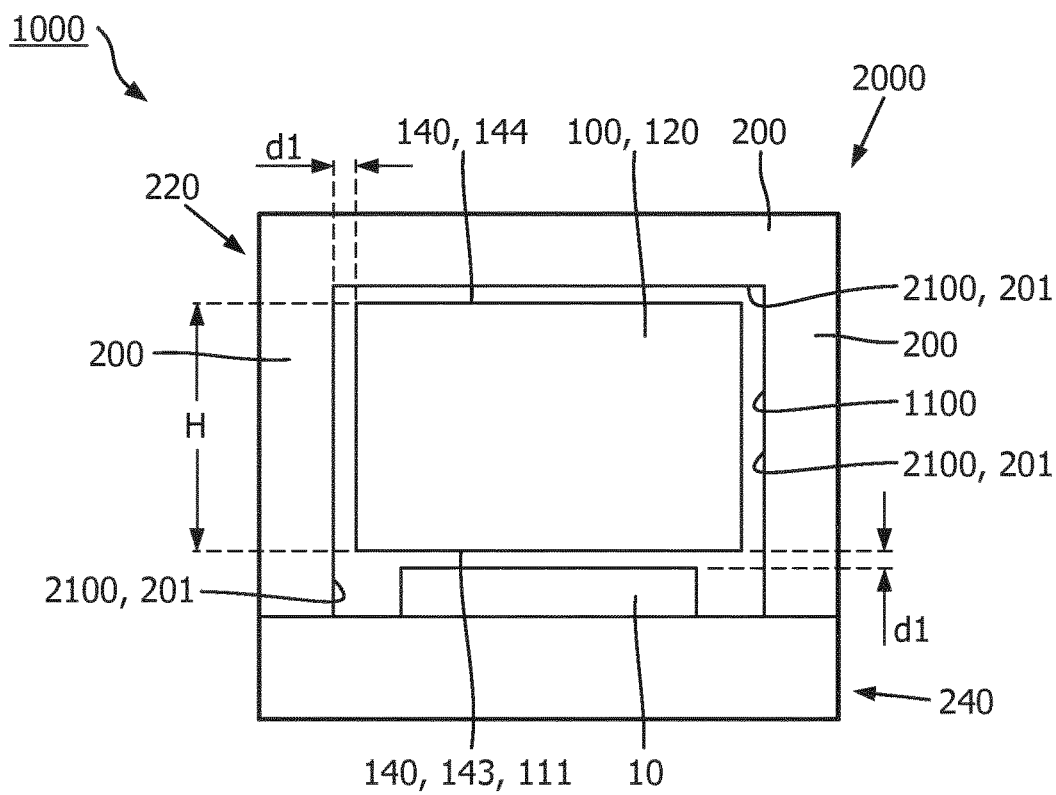
FIG. 2a schematically shows an embodiment of a cross section of configuration with single-sided illumination of luminescent rod. The inner sides of the cooling block(s) may be made reflective or covered by a mirror.
Figure 2B:
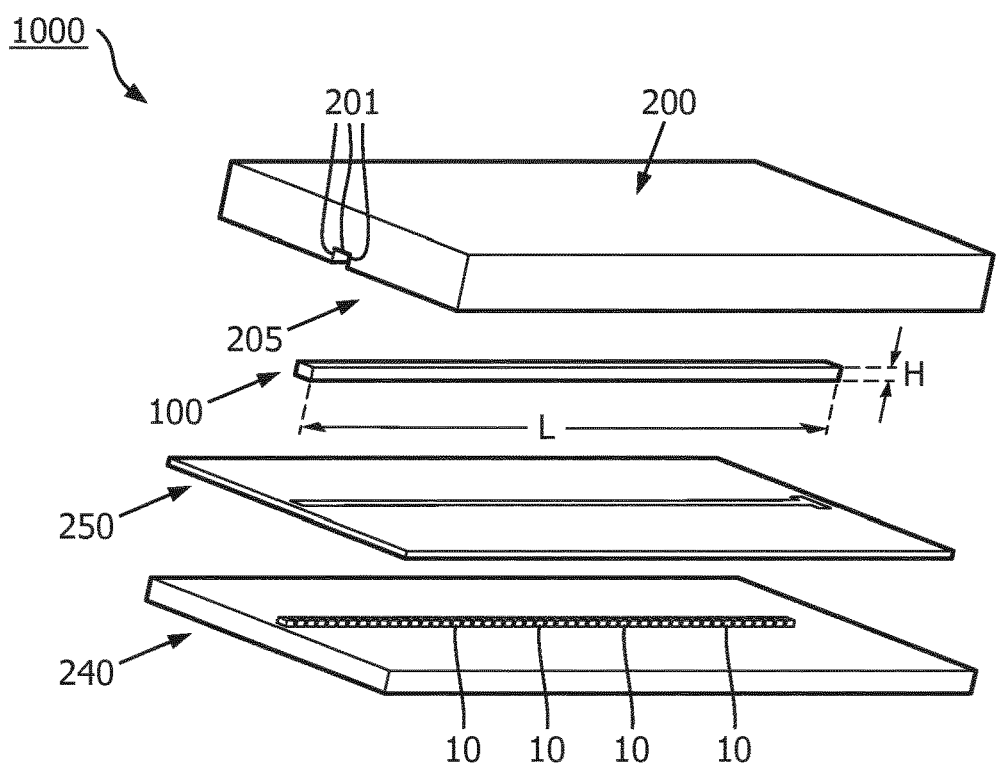
FIG. 2b provides a schematic representation of single-sided concept.

FIGS. 2a-2b schematically depict embodiments of a light generating system 1000 comprising a light source 10 configured to provide light source light 11 and an elongated luminescent body 100 having a length L (see FIG. 2b).

As indicated above, the elongated luminescent body 100 comprises (n) side faces 140, here 4, over at least part of the length. The (n) side faces 140 comprise a first side face 143, comprising a radiation input face 111, and a second side face 144 configured parallel to the first side face 143, wherein the side faces 143, 144 define a height h.

As indicated above, the elongated luminescent body 100 further comprises a radiation exit window bridging at least part of the height h between the first side face 143 and the second side face 144 (see especially FIG. 1a). The luminescent body 100 comprises a garnet type $A_3B_5O_{12}$ luminescent material 120 comprising trivalent cerium, wherein the garnet type $A_3B_5O_{12}$ luminescent material 120 is configured to convert at least part of the light source light 11 into converter light 101.

Further, the light generating system 1000 comprises one or more heat transfer elements 200 in thermal contact with one or more side faces 140 and a reflector 2100 configured at the second side face 144 and configured to reflect light source light 11 escaping from the elongated luminescent body 100 via second face 144 back into the elongated luminescent body 100.

The one or more heat transfer elements 200 are especially configured parallel to at least part of one or more of the side faces 140 over at least part of the length of the elongated luminescent body 100 at a shortest distance (d1) from the respective one or more side faces 140. The shortest distance d1 is especially 1 µm≤d1≤100 µm.

As shown in FIGS. 2a-2b, the one or more heat transfer elements 200 comprise one or more heat transfer element faces 201 directed to one or more side faces 140. As shown in these schematic drawings, the one or more heat transfer elements 200 are at least in thermal contact with all side faces 140 other than the first side face 143. Further, as also shown in these schematic drawings, the one or more heat transfer elements 200 may be configured as a monolithic heat transfer element 220. In embodiments, this monolithic heat transfer element 220 is configured in thermal contact with a support 240 for the light source 10.

A heat transfer element face 201 of the one or more heat transfer element 200 directed to the second face 144 comprises the reflector 2100. Here, all faces 201 directed to the luminescent body 100 comprise such reflector 2100.

FIG. 2b schematically depict another embodiment of the monolithic heat transfer element 220, including a slit 205 configured to host the luminescent body 100. The light sources 10 may be provided as LED bar. The monolithic heat transfer element 220 is used for cooling of the luminescent body 100.

The optional intermediate plate, indicated with reference 250, may serve as a spacer to keep the luminescent body at the desired distance from the light sources and may also serve as a reflector for the light that escapes from the luminescent body side faces. As an alternative, the spacer could be integrated with the one or more heat transfer element 200, especially a top one or more heat transfer element 200 (such as a top cooling block).

In FIGS. 2a-2b, the one or more heat transfer elements are configured within a circle section of at least 180°, here in fact about 270°.

As shown above, the light generating system 1000 comprises in embodiments a plurality of light sources 10 configured to provide light source light 11 and an elongated luminescent body 100 comprising one or more side faces 140, the elongated luminescent body 100 comprising a radiation input face 111 and a radiation exit window 112, wherein the radiation input face 111 is configured in a light receiving relationship with the plurality of light sources 10, wherein the elongated luminescent body 100 comprises luminescent material 120 configured to convert at least part of light source light 11 (received at the radiation input face 111) into luminescent material light 8.

Amongst others, herein a high lumen density (HLD) source is proposed with potentially a 46% improved efficiency as compared to a reference HLD source and without use of a (cerium comprising) garnet rod.

In embodiments, the HLD comprises a transparent round rod or round tube with a transparent thin layer of phosphor-coating on the cylindrical side. As in existing solutions, a mirror can be placed on one outer rod end and an outcoupling optical part like a CPC on the other. The phosphor coating may be applied on the cylindrical side, either fully around or just at a part of the cylindrical side, e.g. facing the LED positions. The phosphor matrix has a tuned refractive index, matching that of the phosphor particles to prevent scattering in the phosphor layer, or nano-sized phosphor particles are used that do no diffract the converted light. Organic phosphors can be used as well.

As the rod is a light guide, the actual TIR occurs at the coating surface. Especially, this coating is relatively smooth at the outside. As phosphor particles may have the size of several microns, it may be needed to overcoat the phosphor coating with a dedicated overcoat with a matched index. Dip coating seems a good way to achieve such.

The phosphor emits light isotropically, which may be a prerequisite for a highly efficient system. However, as the phosphors are applied in a matrix material it may be very important to prevent scattering in the layer. Scattering in the coating may have two major drawbacks. Firstly the converted light may be readily redirected by scattering in the coating layer. After scattering in the layer, the effective converted light distribution may be tending to a Lambertian distribution, perpendicular on the layer surface. Due to this distribution the side extraction of converted light may be very high. Secondly, a drawback may be that converted light traveling around in the rod in TIR can hit the layer again and after scattering it may be redistributed also towards a Lambertian profile, with the same consequence of efficiency loss. The efficiency of the rod may drop to very low values.

An isotropic radiation can be reached by a matrix material of the phosphor with a refractive index that may be equal to that of the phosphor particles. A silicone matrix refractive index can be tuned from 1.4 to 1.9 with addition of titania ($TiO_2$) and/or zirconia ($ZrO_2$) nanoparticles.

Another way to solve the scattering in the phosphor layer may be by nano-sized phosphor particles. These particles may be luminescent material particles comprising a dopant that acts as the activator, or they may be quantum dots, i.e., particles that absorb and re-emit light with optical properties depending on their (nano-scale) size. The effective refractive index of the layer may be that of the mixture of the constituents, which needs to match with the rod.

A third solution may be an organic phosphor, meaning a polymeric phosphor material with no matrix material, or molecularly dispersed in a matrix material.

Some system calculations were performed. The ray efficiency of converted light in the rod-CPC can be calculated using optical principles. Basic assumptions in the modelling were:

A mirror with a typical 95% reflectivity is applied at the back side of the rod

A CPC is placed at the front side with similar index (or in 2 cases with a LuYAG rod with a lower index for the CPC) Isotropic emission from the skin of the rod.

The following data were used in the modelling or were obtained from the modelling:

| Type | Material | Refractive index (550 nm) | CPC | Relative light conversion efficiencies |
|---|---|---|---|---|
| Round coated rod | Fused silica | 1.46 | Same material | 0.72 |
| Round coated rod | Schott crown N-BK7 | 1.52 | Same material | 0.75 |
| Round coated rod | Schott Duran boro tube | 1.47 | Same material | 0.73 |
| Round coated rod | Cdgm crown QK | 1.47 | Same material | 0.73 |
| Round coated rod | High n glass cdgm ZLaF 55D | 1.84 | Same material | 0.84 |
| Round rod | LuYAG | 1.84 | Low n CPC | 0.73 |
| Round rod | LuYAG | 1.84 | High n CPC | 0.84 |
| Block rod | LuYAG | 1.84 | Low n CPC | 0.57 |
| Block rod | LuYAG | 1.84 | High n CPC | 0.68 |

The bold entry in the table indicates a reference system. It appears that the reference system has a converted light ray efficiency in a HLD with rectangular rod (a garnet with low n CPC, last 2 rows) is at max 0.57, a high n CPC with a rectangular rod allows up to 0.68. Further, it appears that the round rod in n=1.84 material allows up to ray efficiencies of 0.84 with a high-n CPC; a gain of 46% w.r.t. current HLD with low n CPC and 24% w.r.t. a high-n CPC. Further, it also appears that optical grade glasses like N-BK7 of Schott enables low optical losses of <2%, and fused silica even has zero losses. Extinction in high-n optical glasses can be low as well, as is the case for CDGM ZLaF-55D. For the calculation a typical path length of 100 mm through the rod is assumed. For a LuYAG block-shaped rod of 60 mm length the average path length travelled through the rod by the rays is 80 mm. The term "relative" indicates that the efficiency is determined relative to the total amount of luminescent material light that is generated in the elongated luminescent body. Hence, a value of 0.57 indicates that 57% leaves the rod (at the light exit window).

Next to round solid rods, a tubular structure may be an option. It may allow a bigger outer diameter of the rod, but it creates challenges to narrow down the tube via a tapered section to obtain a small cross section just before the outcoupling part. A thin walled tube would allow a thin walled spherical cap that has the same function as a mirror.

The absorption of pump light may be in a thin coating layer. To obtain high absorption the phosphor content in the coating should be high, and the actual dopant concentration in the phosphor particles should be high as well, in the case of inorganic luminescent materials.

Especially, in embodiments the coating may be fully around the glass cylindrical side, even with 1 sided pumping, as the pump light traverses and can be absorbed at the opposite side. A reflector placed oppositely of the pump LEDs may enable to have another pass of the pump light through both layers, see e.g. FIG. 5.

Assuming a cerium comprising garnet material, preliminary calculations assuming a 2.5% Ce concentration in the phosphor particles and 40% (volume) particle loading in the matrix and application of a mirror result in a preferred coating layer thickness of around 70 µm to come to an absorption level of 90%. Far thinner luminescent coatings can be achieved by organic phosphor materials or by quantum dot materials.

The phosphor coating may comprise an organic polymeric material, a silicone as the matrix for phosphor particles, or glass as the matrix for phosphor particles. Polymer or silicone-based coatings may be applied in various ways such as dip coating or spraying.

When using a ceramic or high-temperature glass material as the light guide, application of a phosphor in glass coating may be very suitable using the co-sintering route.

Otherwise the glass crystallization route may be favorable.

It may be desirable to apply one or more of the following:

a round rod as carrier with a low optical extinction coefficient, and with a refractive index equal to that of the coating or relatively close to that (or even higher).

a coating with phosphor particles that absorbs incident pump light to a sufficient degree (>80%), if needed in a multilayer to reach the absorption level required.

a coating with a minimum of scattering of converted light.

a relatively very smooth outside surface of the light guide, which may be either the carrier rod or the coating, or an outer coating thereon, to sustain TIR. A matched-index overcoat over the phosphor layer with a very smooth surface may be needed if the phosphor layer as such may be rough.

a CPC with similar refractive index as the rod.

a mirror at the back side of the rod, or a thin-walled spherical cap on a thin walled tube.

For a good light guiding performance of the rod, the typical ray travel length up to a scattering event, usually described as mean free path, needs to be sufficient, like in embodiments mfp>100 mm. A mfp of about 100 mm may be a typical length of the mean optical path in the light guide towards the CPC. Assuming the above derived layer thickness of 70 µm on a 1.3 mm high rod, about 10% of the light guide volume may be built up by the coating. Assuming the carrier to have no scattering, the mfp of the coating could e.g. be mfp_coating>10 mm.

In conclusion, in embodiments the coating matrix material should have such a good index match with the phosphor particles that the scatter level results in mfp_coating>10 mm. Scattering of the coating material can be measured independently of the application.

With the present invention, one or more of the following may be provided and/or achieved:

The complicated to grow single crystal or relatively complicated to produce in a good quality polycrystalline aluminum garnet material as the base material for the rod may be not needed anymore. These garnets are difficult to manufacture and require high transparency and optical smoothness of surfaces, which may be very expensive. Nevertheless, e.g. for thermal reasons such materials may still be used as support material.

The HLD efficiency can go up by 46% at max with respect to reference HLD efficiency. Some losses are expected as well, e.g. for coupling in, 5-10%, for lower absorption efficiency 5%-10%, some absorption by the glass (2%) and outcoupling in rough surfaces (5%-10%).

The potential scattering of converted light in the coating may be solved by index matching of the matrix with the phosphor, by using nano-sized phosphor particles or by using a polymeric phosphor.

The rod-CPC can be pressed as a single part in a mold, no additional assembly of a rod with a CPC may be required then.

The solution may be very versatile. Multiple types of phosphors can be applied.

A glass rod as light guide and carrier for a phosphor layer.

A local phosphor layer as a skin layer on the rod. If the phosphor is a composite of phosphor particles in a matrix, the matrix may essentially have a similar index as the phosphor particles, which may be done by index matching of the matrix, typically done with nano-sized zirconia and/or titania particles, or other types of such oxides (see also above). Another solution for composite phosphor layers may be with use of nano-size phosphor particles dispensed in the matrix or the use of an organic phosphor. Especially the phosphor layer has a relative high index of refraction, n>1.5, more especially n>1.7, ideally n>1.8.

An overcoat of the phosphor layer with the same or a comparable index of refraction as the phosphor coating with a very smooth outer surface.

Pump LEDs facing the phosphor layer at a close distance.

A reflector around the pump LED to increase the coupling in of pump light.

A reflecting cavity around the phosphor layer at opposite side of the pump LEDs.

A CPC or other outcoupling device connected to the glass rod.

A cooling structure to lead away the heat generated in the phosphor layer.

Alternatively, a cylindrical tube may be used as light guide and carrier for a phosphor layer.

In further embodiments, multiple concentrically mounted cylindrical tubes are used as an assembly of light guides carrying a phosphor layer.

Alternatively, other transparent polycrystalline or monocrystalline ceramics may be used as light guide and carrier for a phosphor layer, enabling application of a much larger industrial supply base and fully developed materials.

Alternatively, transparent light guides with a rectangular cross section are used as the carrier for a phosphor layer.

FIGS. 3a-3f schematically depict some embodiments of the elongated luminescent body 100. The elongated luminescent body 100 comprises an elongated support 170 and a coating layer 180. The elongated luminescent body 100 comprises a body axis BA. Further, the elongated luminescent body has a length parameter P of a body dimension perpendicular to the body axis BA. The length parameter P is selected from height H and width W (FIGS. 3c and 3d) and diameter D (FIGS. 3a-3b, 3e and 3f).

In the case of an elongated luminescent body having a circular cross-section, the length parameter P is the diameter D of elongated luminescent body. In the case of an elongated luminescent body having a rectangular cross-section, the length parameter P is the height H or width W of elongated luminescent body, especially the height. When referring to e.g. FIG. 2a, it schematically shows an embodiment wherein illumination with the light source light is done in a direction parallel to the height. Hence, especially the height may be chosen as length parameter P. As also shown in these schematically depicted embodiments, the length parameter P=D or P=H may thus also include the layer thickness (see FIGS. 3a-3d).

FIGS. 3a-3f schematically depict embodiments wherein in a cross-sectional view the entire circumference is provided with the coating layer 180. However, alternatively also part may be provided with the coating layers, e.g. a subset of the support surfaces 172 in FIGS. 3c and 3d, or a part of the circular support surface 172 of the support 170 in FIGS. 3a, 3b, 3e and 3f.

The elongated support 170 comprises a support material 171, such as YAG (undoped), PMMA, glass, or quartz glass. The support material 171 has a support material index of refraction n1, wherein the support material index of refraction n1 is at least 1.5. Further, the support 170 has a support surface 172 on which the coating layer 180 may be provided. The support has a support length L1.

The coating layer 180 is configured on at least part of the support surface 172 over at least part of the support length L1. Here, all schematically depicted embodiments 3a-3d have a coating layer 180 over the entire length, with the coating layer circumferentially enclosing the support 170, but with no coating layer at the end faces.

The coating layer 180 comprises a coating layer material 181. The coating layer material has an index of refraction n2. As indicated above, especially the coating layer index of refraction n2 is at least 1.5. The coating layer 180 has a coating layer thickness d1, such as e.g. up to 100 µm, though other layer thicknesses may also be possible.

The coating layer material 181 has a composition different from the support material 171. The coating layer material 181 at least comprises a luminescent material 120, whereas the support material may not include a luminescent material, and especially certainly not a luminescent material that absorbs in the same wavelength range as the luminescence of the luminescent material. The luminescent material 120 is configured to absorb one or more of UV radiation and visible light, such as from a light source (see also FIGS. 1a, 1b, 1d, 1e, 2a, 2b, 5 and 6) and to convert into luminescent material light 8 having one or more wavelengths in one or more of the visible and the infrared.

The luminescent material may e.g. comprise a cerium comprising garnet, as described above. Instead of cerium doped garnets, or in addition to such garnets, also other luminescent materials may be applied, e.g. embedded in organic or inorganic light transmissive matrixes, as luminescent concentrator. For instance quantum dots and/or organic dyes may be applied and may be embedded in transmissive matrices like e.g. polymers, like PMMA, or polysiloxanes, etc. etc. Other light transmissive material as host matrix may be used as well, see also below.

Quantum dots are small crystals of semiconducting material generally having a width or diameter of only a few nanometers. When excited by incident light, a quantum dot emits light of a color determined by the size and material of the crystal. Light of a particular color can therefore be produced by adapting the size of the dots. Most known quantum dots with emission in the visible range are based on cadmium selenide (CdSe) with a shell such as cadmium sulfide (CdS) and zinc sulfide (ZnS). Cadmium free quantum dots such as indium phosphide (InP), and copper indium sulfide ($CuInS_2$) and/or silver indium sulfide ($AgInS_2$) can also be used. Quantum dots show very narrow emission band and thus they show saturated colors. Furthermore the emission color can easily be tuned by adapting the size of the quantum dots. Any type of quantum dot known in the art may be used in the present invention. However, it may be preferred for reasons of environmental safety and concern to use cadmium-free quantum dots or at least quantum dots having a very low cadmium content.

Instead of quantum dots or in addition to quantum dots, also other quantum confinement structures may be used. The term "quantum confinement structures" should, in the context of the present application, be understood as e.g. quantum wells, quantum dots, quantum rods, or nano-wires.

Organic phosphors can be used as well. Examples of suitable organic phosphor materials are organic luminescent materials based on perylene derivatives, for example compounds sold under the name Lumogen® by BASF. Examples of suitable compounds include, but are not limited to, Lumogen® Red F305, Lumogen® Orange F240, Lumogen® Yellow F083, and Lumogen® F170.

As indicated above, the support material 171 is transmissive for the luminescent material light and especially also one or more of UV radiation and visible light. Further, the conditions $-0.2 \leq n1-n2 \leq 0.2$ (at one or more wavelengths of the luminescent material light) and/or $d1/P \leq 0.25$ apply, i.e. the reflective indices of the coating material and the support material are not differing too much from each other and the coating layer is relatively thin.

As the coating layer 180 is relatively thin the height H and width W, or the diameter D, of the elongated luminescent bodies 100 is essentially the same as the height H1 and width W1, or the diameter D1, of the support 170.

Figure 3A:
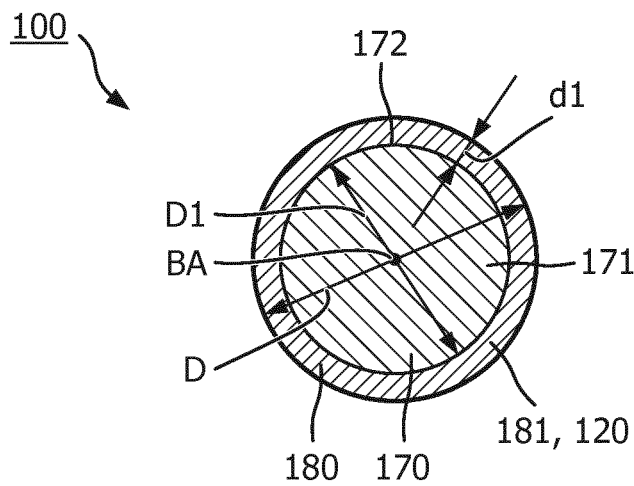
FIGS. 3a-3f schematically depict some embodiments of the elongated luminescent body.
Figure 3B:
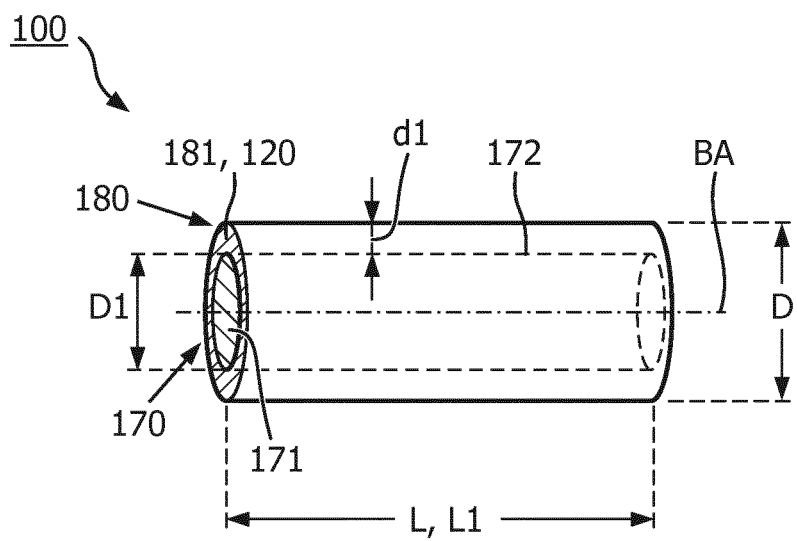
Figure 3C:
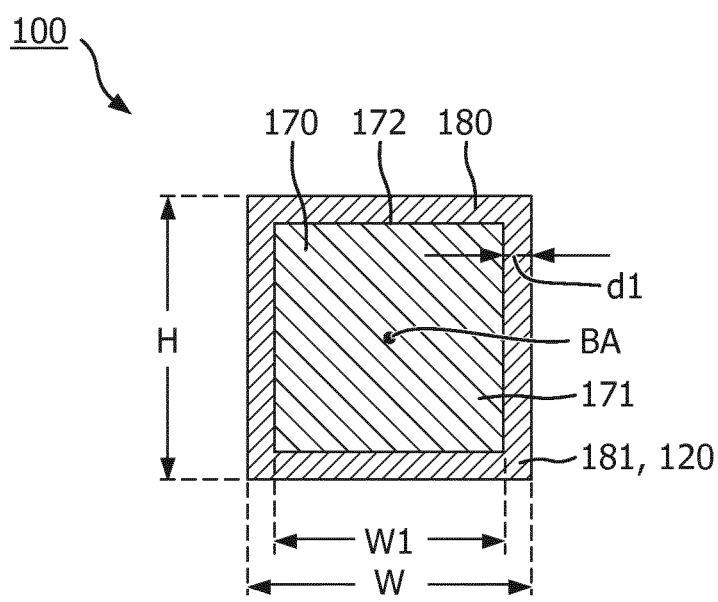
Figure 3D:
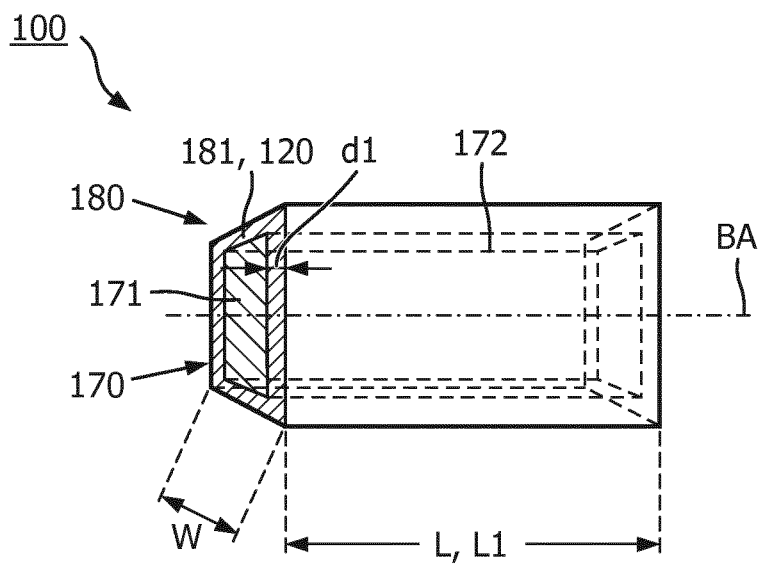

FIGS. 3a, 3b, 3e and 3f schematically depict supports 170, and thereby also elongated luminescent bodies 100, which have an essentially circular cross-section. FIGS. 3c and 3d schematically depicts embodiments with an essentially rectangular (here square) cross-section.

Figure 3E:
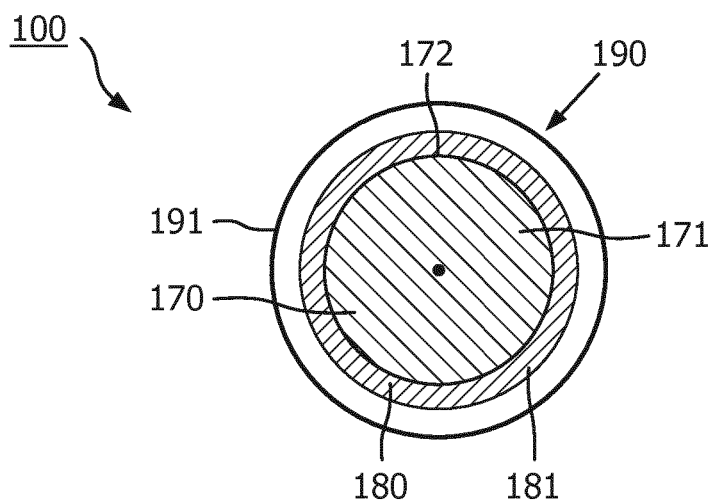

Especially, the surface of the coating layer 180 is smooth in order to limit scattering. It may also be possible to provide a coating on the coating layer, with the coating having a relatively flat surface. Hence, as schematically depicted in FIG. 3e, an outer layer 190 configured over the coating layer 180, may be available. Especially, the same conditions in relation to refractive index and mean free path (for scattering) that may apply to the coating layer may also apply to the outer coating layer 190. Reference 191 indicates the surface layer of the outer coating layer.

Figure 3F:
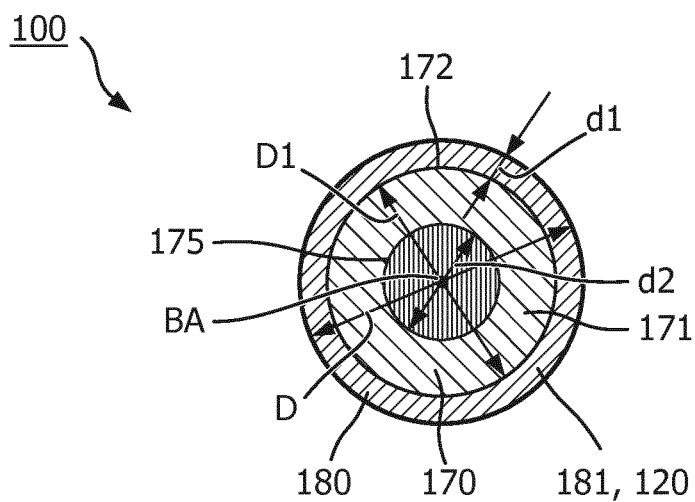

FIG. 3f schematically depicts an embodiment of an elongated luminescent body 100 wherein the elongated support 170 further comprises an elongated core 175 of a material with a thermal conductivity equal to or larger than 20 W m$^{-1}$ K$^{-1}$, preferably equal to or larger than 50 W m$^{-1}$ K$^{-1}$, more preferably equal to or larger than 100 W m$^{-1}$ K$^{-1}$ and most preferably equal to or larger than 150 W m$^{-1}$ K$^{-1}$. As a result, the cooling of the elongated luminescent body 100 is further improved. Examples of materials for the elongated core 175 are ceramics like alumina (30 W m$^{-1}$ K$^{-1}$), SiC (60 W m$^{-1}$ K$^{-1}$) and AlN (160 W m$^{-1}$ K$^{-1}$), or metals like iron, aluminium, bronze, brass or copper (40-400 W m$^{-1}$ K$^{-1}$). The elongated support 170 has a diameter D1 and the elongated core 175 has a diameter d2. The ratio of the diameters d2/D1 is preferably equal to or smaller than 0.5, more preferably equal to or smaller than 0.4, even more preferably equal to or smaller than 0.3, most preferably equal to or smaller than 0.2. In alternative embodiments, with a different shape of the elongated luminescent body 100 or elongated support 170, the ratio P2/P1 is preferably equal to or smaller than 0.5, more preferably equal to or smaller than 0.4, even more preferably equal to or smaller than 0.3, most preferably equal to or smaller than 0.2, with a length parameter P1 of a body dimension perpendicular to the body axis of the elongated support 170, length parameter P2 of a body dimension perpendicular to the body axis of the elongated core 175, and the length parameter P1, P2 is selected from height (H), width (W) and diameter (D). In case of a rectangular cross section the largest dimension (e. height or width) may be selected. Preferably, the coefficient of thermal expension (CTE) of the material used for the elongated core 175 matches with the coefficient of thermal expansion of the material used for the support material 171 such that the difference in the coefficient of thermal expension is equal to or lower than $5 \times 10^{-6}$ K$^{-1}$, more preferably equal to or lower than $4 \times 10^{-6}$ K$^{-1}$, even more preferably $3 \times 10^{-6}$ K$^{-1}$ even more preferably $2 \times 10^{-6}$ K$^{-1}$ and most preferably $1 \times 10^{-6}$ K$^{-1}$. As an example, YAG or LuAG as a support material 171 has a CTE in the range of 6-8$\times 10^{-6}$ K$^{-1}$. In combination with materials like sapphire or AlN (CTE=5$\times 10^{-6}$ K$^{-1}$) for the core 175 a good match between the CTE of both materials is obtained. Alternatively metals like iron (CTE=12$\times 10^{-6}$ K$^{-1}$), nickel (CTE=13$\times 10^{-6}$ K$^{-1}$), platinum (CTE=9$\times 10^{-6}$ K$^{-1}$), tungsten (CTE=4.2-4.6$\times 10^{-6}$ K$^{-1}$), the nickel-cobalt alloy Kovar (CTE=5.3$\times 10^{-6}$ K$^{-1}$), the nickel-molybdenum alloys (CTE=5.2-7.2$\times 10^{-6}$ K$^{-1}$), and titanium (CTE=8.4-8.6$\times 10^{-6}$ K$^{-1}$) or some of its alloys with e.g. tin (for which the CTE goes up to 9.4$\times 10^{-6}$ K$^{-1}$) are suitable materials for the elongated core 175.

The rod can be fully round with a layer on top of the cylindrical surface. A dip coating process using a vertical orientation of the rod seems a viable route. This may thus apply to a rod-shaped support, but this may also apply to a cuboid-shaped support.

Another solution is a partial covering of the cylindrical surface. In that case the phosphor layer may cause unroundness of the rod, which may lead to TIR losses. It may especially be intended to embed the phosphor layer in the rod to have a final round shape, like in e.g. FIGS. 3a and 3b. With an embedded phosphor layer, the profiled rod may be made by a pressing process. A profiled rod may in embodiments refer to a shape that has a shallow cavity to be filled with the (local) phosphor containing coating, in order to provide an essentially circular cross-section.

Figure 4:
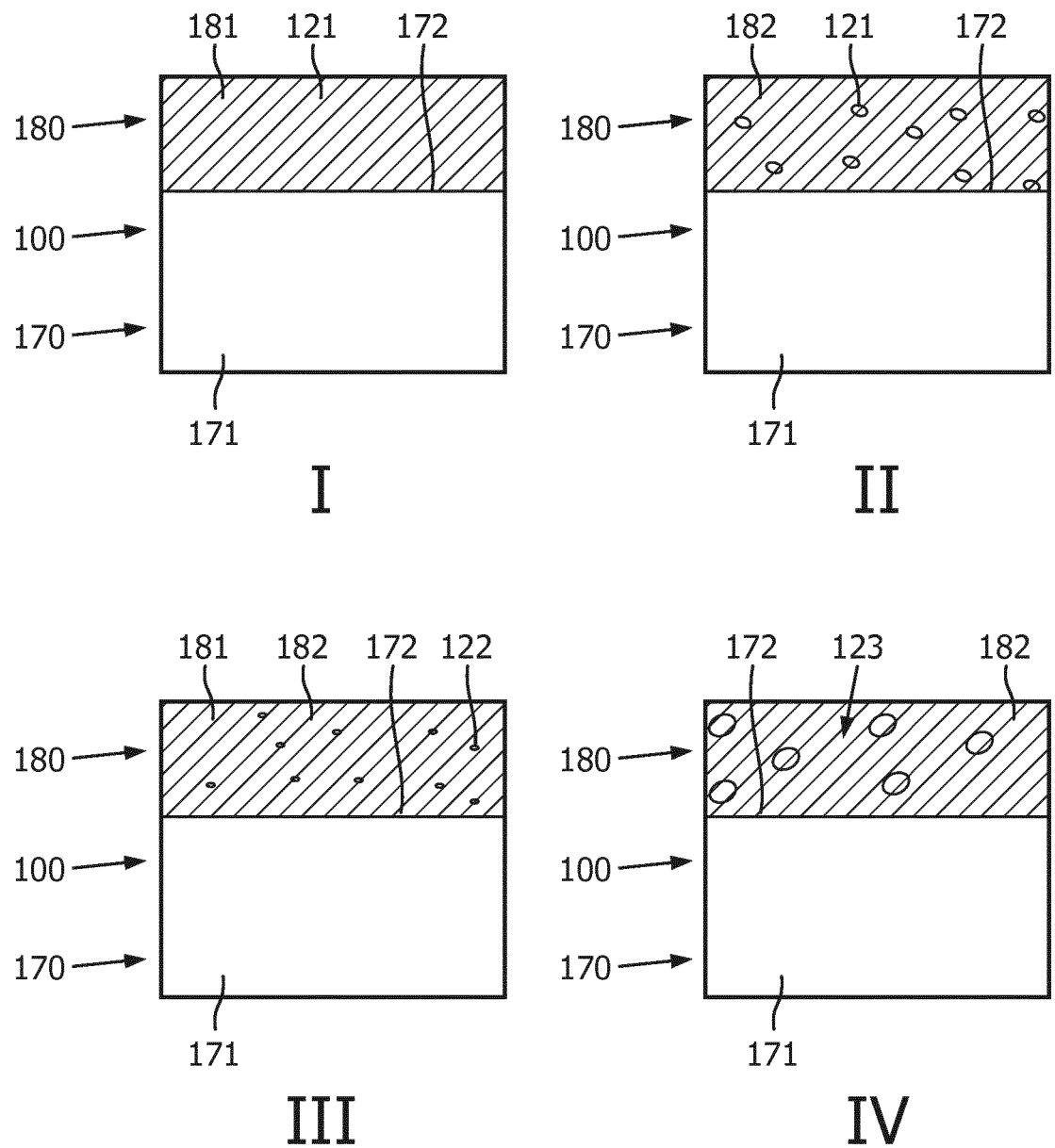
FIG. 4 schematically depict some embodiments of the coating layer.

The drawings of FIG. 4 schematically depict a number of embodiments. For instance, embodiment I may schematically depict an embodiment of the elongated luminescent body wherein the coating layer material 181 comprises an organic dye 121. The organic dye may be provided as such. However, the organic dye may also be provided as e.g. molecular dispersion in a matrix material 182, see embodiment II. Embodiment III may be an embodiment of the elongated luminescent body wherein the coating layer material 181 comprises inorganic luminescent nanoparticles 122, such as quantum dots. Embodiment IV may be an embodiment of the elongated luminescent body 100, wherein the coating layer material 181 comprises a matrix material 182 and an inorganic luminescent material 123 comprising particles (having e.g. weight averaged particle sizes selected from the range of 0.1-20 µm), embedded in a matrix material 182. The matrix material 182 may e.g. be selected from the group consisting of a glass material, a ceramic material, and a polymeric material.

Figure 5:
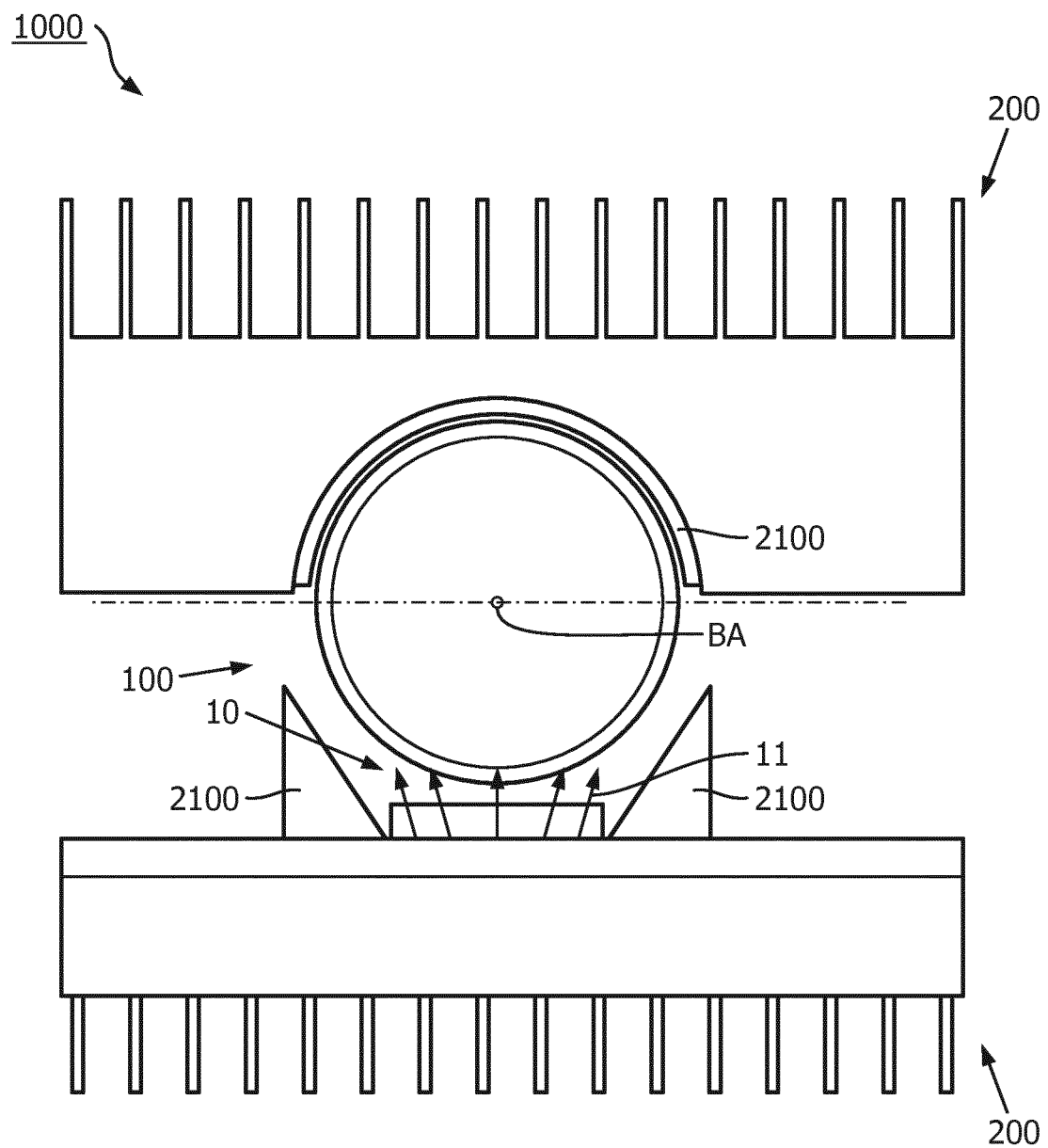
FIG. 5 schematically depicts yet another embodiment of the light generating system.
Figure 6:
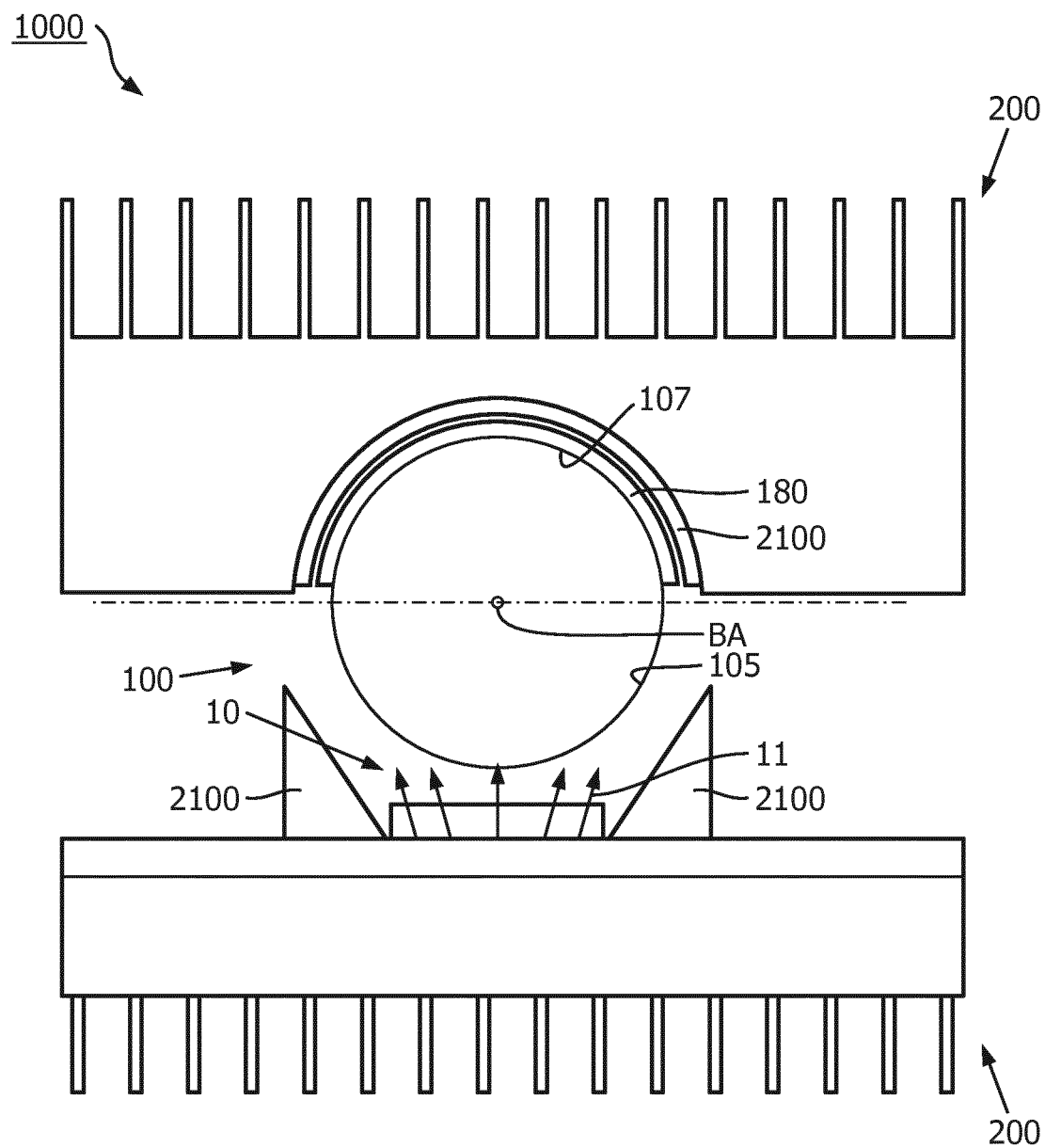
FIG. 6 schematically depicts yet another embodiment of the light generating system.

Reflectors can be used to increase the coupling-in efficiency of the blue pump light, and a reflector can be put at the opposite side of the pump LEDs to send back the light that transmits the layers, see e.g. FIGS. 5 and 6. References 2100 indicate a reflector or reflective surface. Reference 200 indicates a thermal conductive element, such as a heat sink. Part of the rod is in contact with a heat sink that encloses the rod tightly to cool the rod. The enclosure should be done in such a way that there is hardly any optical contact, but the average distance should be kept around 10 micrometer or less. The expansion coefficient of the heat sink should not deviate too much from the rod material. Heat sink materials can be ceramics (like Alumina), copper or aluminum.

More optical elements than depicted herein may be comprised by the system(s).

A further alternative embodiment of a light generating system 1000 is shown in FIG. 6. Only part of the circumferential surface of the elongated luminescent body 100 is provided with a coating layer 180, which is the part that is relatively close to the heat transfer element 200, and this part may be equal to or less than 60%, preferably equal to or less than 50%, more preferably equal to or less than 40%, even more preferably equal to or less than 30%. The reflector or reflective surface 2100 is optional and may be omitted. The elongated luminescent body 100 has a first surface 105 that comprises the light input face. The elongated luminescent body 100 has a second surface 107 on which the coating layer 180 is configured. The first surface 105 is opposed to the second surface 107. As the coating layer 180 is relatively close to the heat transfer element 200, the cooling of the elongated luminescent body 100 is improved, because the transfer of the heat generated in coating layer 180 to the heat transfer element 200 is improved. Hence, the average temperature of the elongated luminescent body 100 is lower compared to a light generating system with a luminescent body 100 that has a coating layer 180 around its full circumferential surface. The elongated luminescent body 100 is partly enclosed by the heat transfer element 200. Alternatively, the elongated luminescent body 100 is enclosed by the heat transfer element 200 for at least 60% of the circumferential surface of the elongated luminescent body 100, preferably for at least 70%, more preferably for at least 80%. As a result, the cooling of the elongated luminescent body 100 is further improved. The distance between the elongated luminescent body 100 and the heat transfer element 200 is in the range of 2-20 µm. The term "plurality" refers to two or more.

The terms "substantially" or "essentially" herein, and similar terms, will be understood by the person skilled in the art. The terms "substantially" or "essentially" may also include embodiments with "entirely", "completely", "all", etc. Hence, in embodiments the adjective substantially or essentially may also be removed. Where applicable, the term "substantially" or the term "essentially" may also relate to 90% or higher, such as 95% or higher, especially 99% or higher, even more especially 99.5% or higher, including 100%.

The term "comprise" includes also embodiments wherein the term "comprises" means "consists of".

The term "and/or" especially relates to one or more of the items mentioned before and after "and/or". For instance, a phrase "item 1 and/or item 2" and similar phrases may relate to one or more of item 1 and item 2. The term "comprising" may in an embodiment refer to "consisting of" but may in another embodiment also refer to "containing at least the defined species and optionally one or more other species".

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

The devices, apparatus, or systems may herein amongst others be described during operation. As will be clear to the person skilled in the art, the invention is not limited to methods of operation, or devices, apparatus, or systems in operation.

It should be noted that the above-mentioned embodiments illustrate rather than limit the invention, and that those skilled in the art will be able to design many alternative embodiments without departing from the scope of the appended claims.

In the claims, any reference signs placed between parentheses shall not be construed as limiting the claim.

Use of the verb "to comprise" and its conjugations does not exclude the presence of elements or steps other than those stated in a claim. Unless the context clearly requires otherwise, throughout the description and the claims, the words "comprise", "comprising", and the like are to be construed in an inclusive sense as opposed to an exclusive or exhaustive sense; that is to say, in the sense of "including, but not limited to".

The article "a" or "an" preceding an element does not exclude the presence of a plurality of such elements.

The invention may be implemented by means of hardware comprising several distinct elements, and by means of a suitably programmed computer. In a device claim, or an apparatus claim, or a system claim, enumerating several means, several of these means may be embodied by one and the same item of hardware. The mere fact that certain measures are recited in mutually different dependent claims does not indicate that a combination of these measures cannot be used to advantage.

The invention also provides a control system that may control the device, apparatus, or system, or that may execute the herein described method or process. Yet further, the invention also provides a computer program product, when running on a computer which is functionally coupled to or comprised by the device, apparatus, or system, controls one or more controllable elements of such device, apparatus, or system.

The invention further applies to a device, apparatus, or system comprising one or more of the characterizing features described in the description and/or shown in the attached drawings. The invention further pertains to a method or process comprising one or more of the characterizing features described in the description and/or shown in the attached drawings.

The various aspects discussed in this patent can be combined in order to provide additional advantages. Further, the person skilled in the art will understand that embodiments can be combined, and that also more than two embodiments can be combined. Furthermore, some of the features can form the basis for one or more divisional applications.

The invention claimed is:

1. A light generating system comprising:
  a plurality of light sources configured to provide light source light;
  an elongated luminescent body comprising an elongated support and a coating layer, wherein the elongated luminescent body further comprises a body axis (BA), and a length parameter P of a body dimension perpendicular to the body axis (BA), wherein the length parameter P is selected from height (H), width (W) and diameter (D), wherein:
  the elongated support comprises a support material-, a support material index of refraction n1, wherein the support material index of refraction n1 is at least 1.4, a support surface, and a support length;
  the coating layer is configured on at least part of the support surface over at least part of the support length, wherein the coating layer comprises a coating layer material, a coating layer index of refraction n2, wherein coating layer index of refraction n2 is at least 1.4, and a coating layer thickness (d1), wherein the coating layer material has a composition different from the support material, wherein the coating layer material comprises a luminescent material configured to absorb one or more of UV radiation and visible light, and to convert into luminescent material light having a wavelength at a spectral maximum of the luminescent material light in one or more of the visible and the infrared; the support material is transmissive for the luminescent material light, and $-0.2 \leq n1-n2 \leq 0.2$ and $d1/P \leq 0.25$ apply, wherein the coating layer or an outer layer configured over the coating layer, has a root mean square height Sq of at maximum 1/10 of a wavelength at a spectral maximum of the luminescent material light, and wherein the elongated luminescent body comprising one or more side faces, wherein the elongated luminescent body comprises a radiation input face and a radiation exit window, wherein the radiation input face is configured in a light receiving relationship with the plurality of light sources, wherein the luminescent material configured to absorb at least part of the light source light and convert into the luminescent material light, and wherein the radiation input face is configured perpendicular to the light exit window.

2. The light generating system according to claim 1, wherein the coating layer, or where available an outer layer configured over the coating layer, has a root mean square height Sq of at maximum 1/20 of a wavelength at a spectral maximum of the luminescent material light.

3. The light generating system according to claim 1, wherein $-0.1 \leq n1-n2 \leq 0.2$, and $d1/P \leq 0.2$ applies.

4. The light generating system according to claim 1, wherein the length parameter P is selected from the range of 0.5-100 mm.

5. The light generating system according to claim 1, wherein the support material comprises one or more of a glass material, a single crystal, a ceramic material, and a polymeric material, and wherein the support material has a mean free path for a wavelength at a spectral maximum of the luminescent material light of at least 50 mm.

6. The light generating system according to claim 1, wherein the coating layer material has a mean free path MFP for a wavelength at a spectral maximum of the luminescent material light, wherein $MFP \geq MFP_{min}$, where $MFP_{min} = c*L1*d1/P$, and where $c=0.25$.

7. The light generating system according to claim 1, wherein the coating layer material comprises one or more of an organic dye and inorganic luminescent nanoparticles.

8. The light generating system according to claim 1, wherein the coating layer material comprises a matrix material and an inorganic luminescent material comprising particles having weight averaged particle sizes selected from the range of 0.1-20 μm, embedded in a matrix material, wherein the matrix material is selected from the group consisting of a glass material, a ceramic material, and a polymeric material.

9. The light generating system according to claim 8, wherein the matrix material has a matrix material index of refraction n21, and wherein the luminescent material has a luminescent material index of refraction n22, wherein $0.02 \leq n21-n22 \leq 0.02$.

10. The light generating system according to claim 1, wherein the support material comprises one or more of a glass material and a polymeric material, wherein the coating layer material comprises one or more of an organic dye, a glass material, and a polymeric material, and wherein the elongated luminescent body has a round, an oval, or a rectangular cross-section perpendicular to the body axis (BA).

11. The light generating system according to claim 1, wherein the elongated luminescent body is associated to a light extraction body or forms a monolithic body with a light extraction body.

12. The light generating system according to claim 1, wherein the circumferential surface of the elongated luminescent body is partially provided with a coating layer in an amount equal to or less than 60%.

13. The light generating system according to claim 1, wherein the elongated support further comprises an elongated core of a material with a thermal conductivity equal to or larger than 20 W m$^{-1}$ K$^{-1}$ and wherein the ratio P2/P1 is equal to or smaller than 0.5, with a length parameter P1 of a body dimension perpendicular to the body axis of the elongated support, length parameter P2 of a body dimension perpendicular to the body axis of the elongated core, and the length parameter P1, P2 is selected from height (H), width (W) and diameter (D).

14. A projection system comprising the light generating system according to claim 13.

15. A luminaire or a lamp comprising the system according to claim 13.

* * * * *